US008710453B2

(12) United States Patent  
Parker

(10) Patent No.: US 8,710,453 B2  
(45) Date of Patent: Apr. 29, 2014

(54) CHARGED PARTICLE SOURCE WITH MULTIPLE SELECTABLE PARTICLE EMITTERS

(75) Inventor: N. William Parker, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 200 days.

(21) Appl. No.: 13/341,487

(22) Filed: Dec. 30, 2011

(65) Prior Publication Data

US 2012/0168638 A1 Jul. 5, 2012

Related U.S. Application Data

(60) Provisional application No. 61/429,014, filed on Dec. 31, 2010.

(51) Int. Cl.
 *H01J 31/48* (2006.01)
(52) U.S. Cl.
 USPC ............... 250/396 R; 250/396 ML; 250/281; 250/423 R
(58) Field of Classification Search
 USPC .............................. 250/307, 306, 397, 396 R
 See application file for complete search history.

(56) References Cited

U.S. PATENT DOCUMENTS

| | | | |
|---|---|---|---|
| 4,426,582 A * | 1/1984 | Orloff et al. | 250/396 ML |
| 4,914,305 A | 4/1990 | Benveniste et al. | |
| 5,001,349 A * | 3/1991 | van der Mast | 250/396 R |
| 5,534,311 A * | 7/1996 | Shaw et al. | 427/526 |
| 5,637,951 A | 6/1997 | Parker | |
| 6,617,587 B2 | 9/2003 | Parker et al. | |
| 6,734,428 B2 | 5/2004 | Parker et al. | |
| 6,738,506 B2 | 5/2004 | Miller et al. | |
| 6,844,550 B1 | 1/2005 | Yin et al. | |
| 6,894,435 B2 * | 5/2005 | Aviel et al. | 315/167 |

(Continued)

FOREIGN PATENT DOCUMENTS

| | | |
|---|---|---|
| JP | 2005251440 | 9/2005 |
| WO | 2010109454 | 9/2010 |

OTHER PUBLICATIONS

European Office Action for Appl. No. 11194720.6 dated Jan. 28, 2013.

*Primary Examiner* — Nikita Wells  
*Assistant Examiner* — Johnnie L Smith  
(74) *Attorney, Agent, or Firm* — Scheinberg & Associates, PC; Michael O. Scheinberg; James Wolfe

(57) ABSTRACT

A charged particle source for a focused particle beam system such as a transmission electron microscope (TEM), scanning transmission electron microscope (STEM), scanning electron microscope (SEM), or focused ion beam (FIB) system is disclosed. The source employs a multiplicity of independently-addressable emitters within a small region which can be centered on the axis of the charged particle system. All of the emitters may be individually controlled to enable emission from one or more tips simultaneously. A mode with only one emitter activated corresponds to high brightness, while modes with multiple emitters simultaneously activated provides high angular intensities with lower brightness. Source lifetimes can be extended through sequential use of single emitters. A combined mechanical and electrical alignment procedure for all emitters is described.

20 Claims, 15 Drawing Sheets

(56) References Cited

U.S. PATENT DOCUMENTS

| | | |
|---|---|---|
| 6,943,351 B2 | 9/2005 | Parker et al. |
| 6,977,375 B2 | 12/2005 | Yin et al. |
| 7,456,402 B2 | 11/2008 | Parker et al. |
| 8,253,118 B2 | 8/2012 | Zhang et al. |
| 2004/0036398 A1* | 2/2004 | Jin ............................. 313/309 |
| 2004/0085024 A1* | 5/2004 | Aviel et al. ................. 315/169.3 |
| 2004/0135526 A1* | 7/2004 | Winkler et al. ............... 315/382 |
| 2005/0269528 A1* | 12/2005 | Kruit ....................... 250/492.22 |
| 2008/0049888 A1* | 2/2008 | Leung et al. ..................... 378/4 |
| 2009/0065711 A1* | 3/2009 | Kruit ....................... 250/492.22 |
| 2009/0256075 A1* | 10/2009 | Kemen et al. ................. 250/307 |

* cited by examiner

CHARGED PARTICLE SOURCE WITH MULTIPLE SELECTABLE PARTICLE EMITTERS This application claims priority from U.S. Pro. App. No. 61/429,014, filed Dec. 31, 2010, which is hereby incorporated by reference.

TECHNICAL FIELD OF THE INVENTION

The present invention relates generally to focused charged particle beam systems and, in particular, to charged particle sources used to generate focused charged particle beams.

BACKGROUND OF THE INVENTION

In charged particle systems, comprising both electron microscopes and focused ion beam systems, a column is typically used to focus a charged particle beam onto the surface of a target to be imaged and (optionally) processed using the beam. In these columns, a charged particle source generates the initial beam of electrons or ions, which then passes into a charged particle "gun", which typically focuses the charged particles into a roughly parallel beam which enters the main body of the column where this beam may be blanked (i.e., turned on and off), deflected (moved around on the target surface), and focused onto the surface of the target. The component within the source from which the charged particles originate is termed the "emitter", typically comprising a very sharp metal point. Generally, in the prior art, the charged source has comprised a single charged particle emitter, such as a cold-field emitter or Schottky emitter for electrons, or a gaseous field ionization or liquid metal ion source for ions (normally positively charged). In the case of liquid metal ion sources (LMIS), this metal point is a liquid, but in other source types, the metal is a solid, often called a "tip". Carbon nanotubes can also be used as electron emitters. In all cases, however, these emitters are characterized by a finite lifetime, limited by various factors such as surface contamination, or ion bombardment erosion of the tip, causing it to become blunter over time until emission is no longer sustainable at acceptable extraction voltages.

For optimized operation of the charged particle column, it is necessary for the source to be precisely aligned to the symmetry (or optical) axis of the column, typically to within 5 to 20 μm. Thus, charged particle sources are generally supported by multi-axis motion assemblies allowing source motion during system operation. The image formed by the column on a target is observed, and the source is then moved until the image is has sufficient contrast and resolution for the particular application required. In some cases, the charged particle beam may be used for processing of the target, in addition to imaging, such as electron beam induced etching (EBIE), electron beam induced deposition (EBID), ion milling, ion beam induced etching (IBIE), ion beam induced deposition (IBID), secondary ion mass spectrometry (SIMS), etc.

SUMMARY OF THE INVENTION

An object of the invention is to configure a multiple emitter charged particle source within a focused charged particle system to be capable of operating in multiple emission modes.

Some emission modes enable much longer source lifetimes than previously attainable through the sequential use of a multiplicity of single emitters, used one after the other. The overall source lifetime is then the sum of the individual emitter lifetimes. Other emission modes use the multiplicity of emitters to achieve high beam currents for rapid processing of a target.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
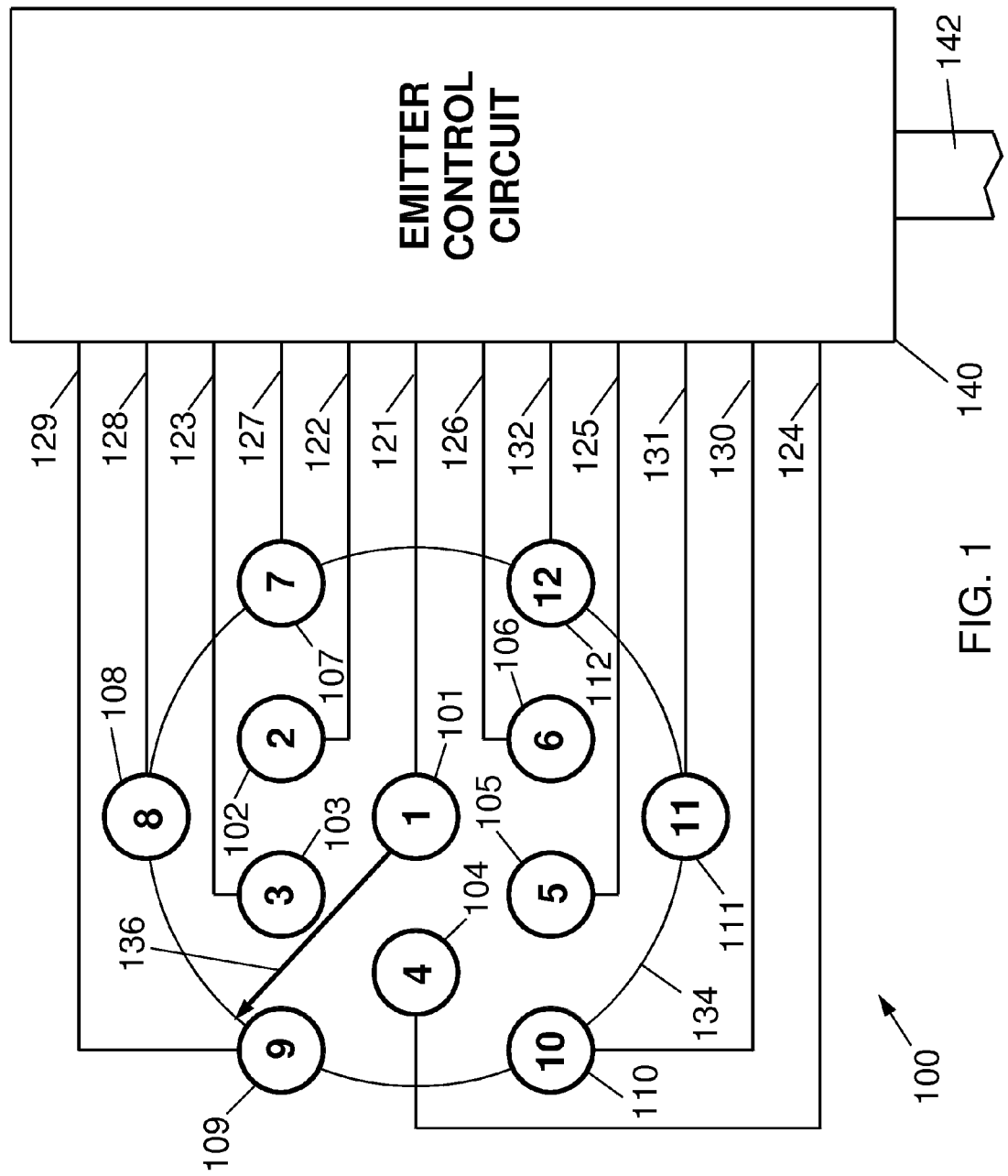
FIG. 1 shows a schematic diagram of a charged particle source with multiple charged particle emitters and an emitter control circuit.

The present invention applies to charged particle systems employing focused beams of charged particles (electrons or ions) to image and (optionally) process a target. These systems typically employ a charged particle source to form an initial beam which is then accelerated, focused, blanked, and deflected by electrostatic and (optionally) magnetic elements within the column such as lenses, blankers, and deflectors. The proper operation of the source is critical for acceptable functioning of the charged particle system. Source operation may typically be characterized by the following parameters (among others):

1) The total emission current.
2) The emission pattern, i.e., how do the particles emerge from the source?
3) The emission energy distribution.
4) The virtual source size, i.e., how large does the emitting area appear to be?
5) The source lifetime, i.e., how many hours does it emit before degrading?

Embodiments of the charged particle source of the present invention enable greater control over several of the above parameters than is possible with prior art single emitter sources. Embodiments can use any type of emitter, such as cold field emitters (CFEs), including Spindt tip emitters, carbon nanotube emitters, Schottky sources, gaseous field ionization sources (GFIS), and liquid metal ion sources (LMIS).

Embodiments of the invention can operate in several modes. In high brightness operating modes, a charged particle beam is generated from a single emitter activated out of the multiplicity of emitters—this mode is characterized by high brightness and moderate emission currents, with very small virtual source sizes enabling the formation of small focused spots on the surface of a target. In high angular intensity operating modes, multiple emitters out of the multiplicity of emitters are simultaneously activated to produce higher total beam currents (and thus higher angular intensities), but at the expense of larger virtual source sizes and lower brightnesses—this mode enables the formation of high current larger spots on the surface of a target. The multiple independently-addressable emitter sources of the present invention are characterized by alternative means for addressing individual emitters, either at the backside or the frontside of the array. By "independently-addressable" is meant that the emitters can be independently caused to emit or not to emit charged particles. While embodiments show each emitter as independently addressable, in some embodiments, groups of emitters may be addressable. For example, a center emitter may be independently addressable, while a ring of off-axis emitters is addressable as a group independent of the center emitter, although not each emitter in the ring may be separately addressable. Seven exemplary embodiments of the invention are described, comprising cold field emitters for electrons, and both gaseous field ionization (GFI) and liquid metal ion (LMI) sources for ions.

In an operating mode with multiple emitters simultaneously activated, larger total emission currents are possible than in the prior art. Using the multiple emitters sequentially, one at a time, enables substantial increases in source lifetimes over the prior art. Several of the other parameters will be the same as for the prior art, such as the emission pattern (a function of the tip geometry), the emission energy distribution (a function of a number of tip- and emission current-related factors), and the source size (in the case of single emitter operation).

In several preferred embodiments, the multiplicity of emitters within the source is within a small enough radius of the column axis that all emitters may be considered to be aligned and small alignment deflections can be used. Representative electrical control circuits are presented for two different emitter addressing schemes (backside and frontside), along with an analysis of the angular intensity and brightness of the present invention operating in different emission modes (single-emitter and multiple-emitter). Finally, an alignment procedure is described for all emitters within the source, enabling optimized performance in all operating modes for tips both on- and off-axis.

The following sections first describe the multiple-emitter source concept with respect to overall source size and an exemplary compact distribution of emitters within a source. Next, a column capable of implementing the source of the present invention is described, along with representative on- and off-axis trajectories illustrating mechanical and electrostatic beam alignment to the main lens which forms the focused spot on the target. Next, seven embodiments of the invention are described, comprising both electron and ion sources, and illustrating two methods for independent addressing of individual emitters within the source. Simplified electrical control circuits for the sources are presented, demonstrating methods for activating both single and multiple emitters. The origins of the source angular intensity and brightness in various operating modes are discussed, illustrating both high brightness and high angular intensity operation. Finally, an alignment procedure for both a center (on-axis) emitter and multiple off-axis emitters is presented.

Charged Particle Source with Multiple Independently-Addressable Charged Particle Emitters FIG. 1 shows a schematic diagram of a charged particle source 100 with multiple charged particle emitters 101-112 and an emitter control circuit 140. A first emitter 101 is located at the center of the emitter array. Surrounding emitter 101 is a first ring of five emitters 102-106. A second ring of six emitters 107-112 surrounds the first ring of emitters. A total of twelve emitters 101-112 are thus located within a circle 134 of radius 136 centered on emitter 101. Control line 121-132 are each connected to a respective emitter 101-112, e.g., control line 121 determines whether emitter 101 is active (i.e., emitting charged particles), etc. The emitter control circuit 140 is, in turn, controlled through control cable 142 which is connected to the charged particle system controller (not shown). Details of the architectures of the emitters 101-112 are provided in the descriptions of the first through seventh embodiments below (FIGS. 5-11). Details of the control circuitry for the various embodiments are provided in FIGS. 12-13, below.

A consideration for the proper operation of any charged particle source in a charged particle column, such as a scanning electron microscope (SEM), transmission electron microscope (TEM), scanning transmission electron microscope (STEM), focused ion beam (FIB) column, etc., is the alignment of the charged particle source to the optical axis of the column. Typically, the emitter of a conventional (i.e., single emitter) charged particle source is mechanically aligned to the column axis within at most 5 to 20 µm. The exact amount of misalignment that can be tolerated is determined by details of the column design and operating mode, in particular, the demagnification of the source to the target. Excessive misalignments will induce off-axis geometric and chromatic aberrations which will adversely affect the attainable beam spot size, shape and current density at the target. Thus, charged particle sources are generally mounted in mechanical motion assemblies enabling the source to be physically aligned to the column axis during operation of the charged particle system. One procedure which is frequently employed to aid in this real-time alignment process is "wobbling" of the voltage or current in the lens in the gun which contains the charged particle source. This wobbling constitutes a very low frequency (typically 0.1-0.3 Hz) small variation in the strength of the lens which causes an oscillatory motion of an image of the target in the event that the charged particle source is misaligned to the axis of the lens in the gun. Using X-Y motions (and in some cases, Z and tilt motions, where Z is the column axis), the source is then moved to reduce or (preferably) eliminate this image "wobble", thereby indicating that the source has been mechanically aligned to the column.

Figure 16:
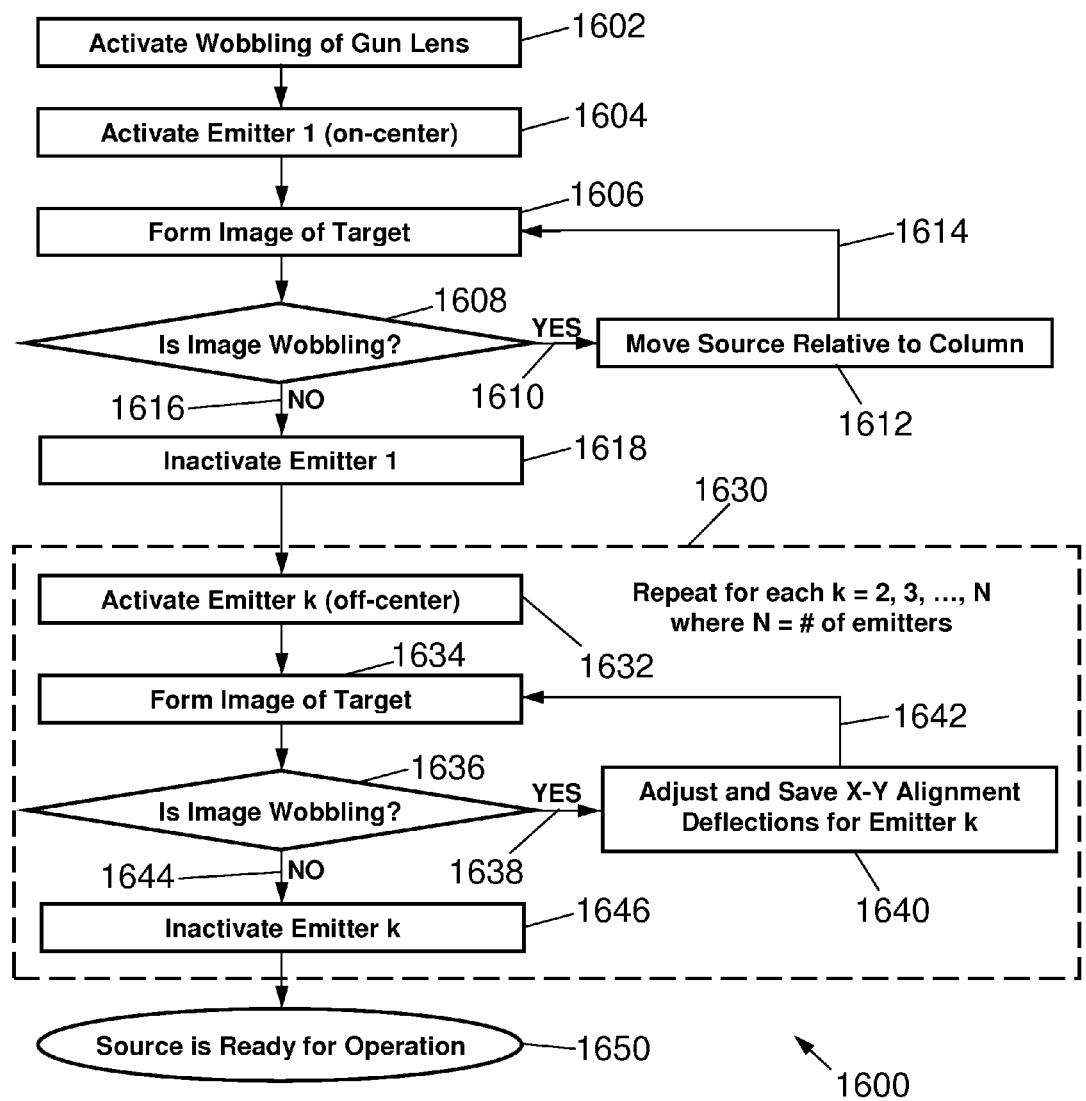
FIG. 16 is a flow chart for an alignment process applicable to the multiple emitter source of the present invention.

Charged particle sources having an array of emitters is contained in the source present a complication to this alignment procedure, since only one of these emitters can be physically positioned on the axis of the column at a time. FIG. 16, which will be described in more detail below, outlines an alignment process applicable to the multiple emitter source of the present invention. Other alignment processes could also be used. The process of FIG. 16 first aligns the center emitter mechanically to the column axis using a beam "wobbling" process as is familiar to those skilled in the art. The center emitter is considered to be aligned to the axis by a lack of image wobbling. After this is accomplished, each of the other (off-axis) emitters is activated in turn and the required X-Y settings for the alignment deflectors (which may be the beam deflectors used for imaging of the target) needed to eliminate image wobbling is determined Note that in the described embodiments: 1) the center emitter may be mechanically aligned to the column (making it on-axis), 2) all the off-axis emitters are electrically align, and 3) each off-axis emitter has separate and unique X-Y alignment deflections since each emitter has a different mechanical offset from the column axis.

Embodiment of a Charged Particle Column

Figure 2:
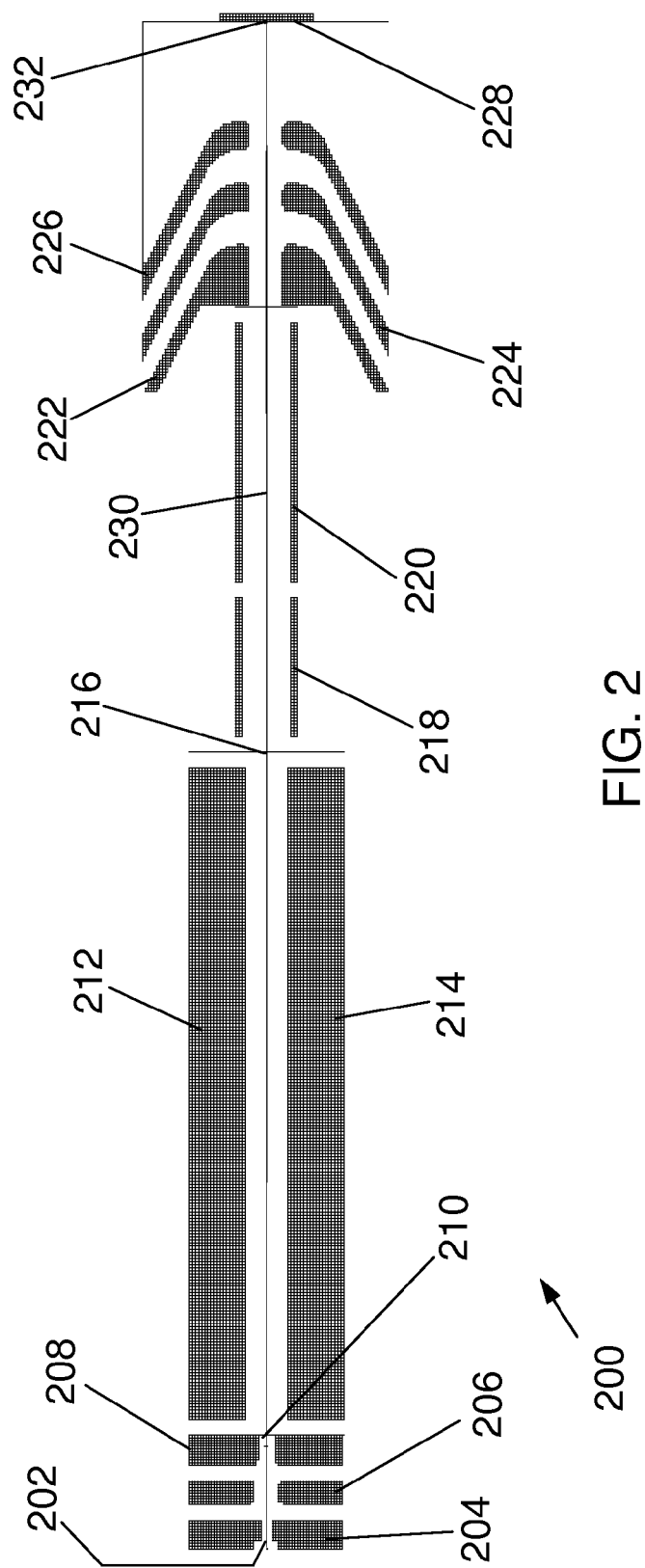
FIG. 2 is a side cross-sectional view of an exemplary charged particle column capable of implementing the multiple emitter charged particle source of the present invention.

FIG. 2 is a side cross-sectional view of an exemplary charged particle column 200 capable of implementing charged particle sources 202 of the present invention. An "extraction" voltage is applied between the source 202 and the extraction electrode 204. If source 202 emits electrons, this bias voltage may be typically +3000 to +5000 V. If source 202 emits positive ions, this bias voltage may be typically −7000 to −15000 V. In all cases, the emitters in the source 202 typically comprise very sharp structures such as needles or cones (commonly called "tips") which tend to concentrate nearly all the voltage drop between the emitter 202 and the extractor 204 in the vicinity (10 s of µm) of the emitter tips. The initial emission of charged particles is generally into a cone with a half-angle of around 30° (i.e., a solid angle of $\pi$ ($\pi$ 30°/180°)$^2 \approx$0.86 steradians). The charged particle "gun" comprises the source 202, extractor 204, gun focus electrode 206, and gun exit electrode 208. The beam-defining aperture (BDA) 210 is also shown in the gun, mounted within the gun exit electrode 208. A focus voltage is applied to the gun focus electrode 206, and the gun exit electrode 208 is biased to ground potential (0 V)—thus in this example, since the target is also biased to ground potential, the charged particles leaving the gun are already at their final beam energy. The different voltages on the extractor 204, focus electrode 206 and exit electrode 208 induce electric fields within the gun on and near to the column axis—these electric fields deflect and focus the charged particles, as shown in the trajectory diagrams of FIGS. 3 and 4. In some cases there is minimal focusing effect, especially for cases in which smaller beams are desired at the target and therefore higher source demagnifications are required. In other cases, the gun will form a generally parallel beam which is then focused onto the target by the main lens at a lower demagnification, producing a larger beam with higher current. Below the gun is the beam blanker, comprising electrodes 212 and 214. When the beam is on, electrodes 212 and 214 are both typically at 0 V, and thus the beam 230 passes through the blanker and BBA 216 undeflected. To turn the beam off, a positive voltage is applied to electrode 212 and a negative voltage to electrode 214, thereby causing the beam 230 to be deflected off axis to strike the BBA 216. Typical blanking voltages may be 5 to 10 V.

Figure 3:
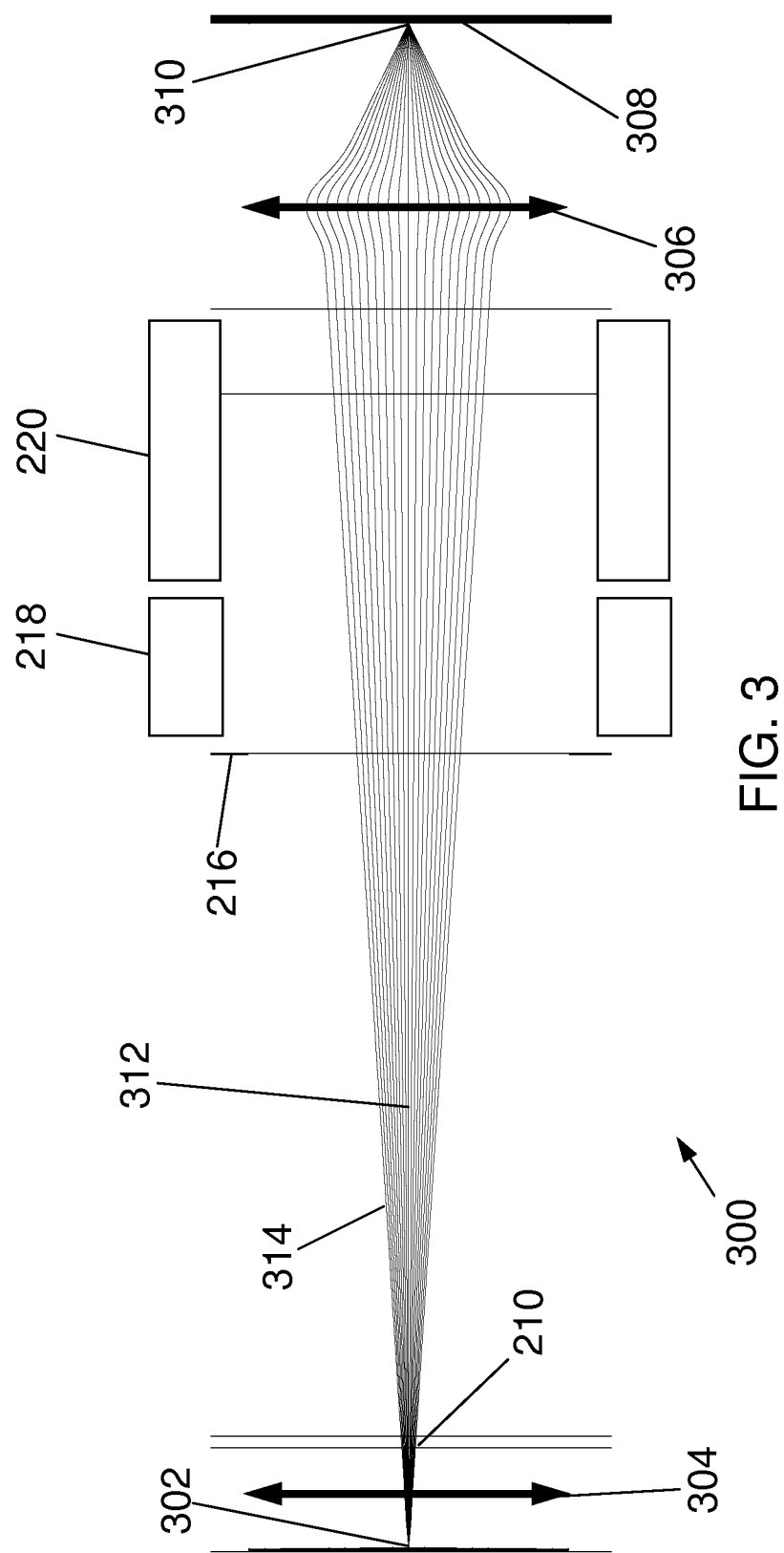
FIG. 3 is a side view of charged particle trajectories for an on-axis emitter in the source of FIG. 1 traversing the column of FIG. 2.
Figure 4:
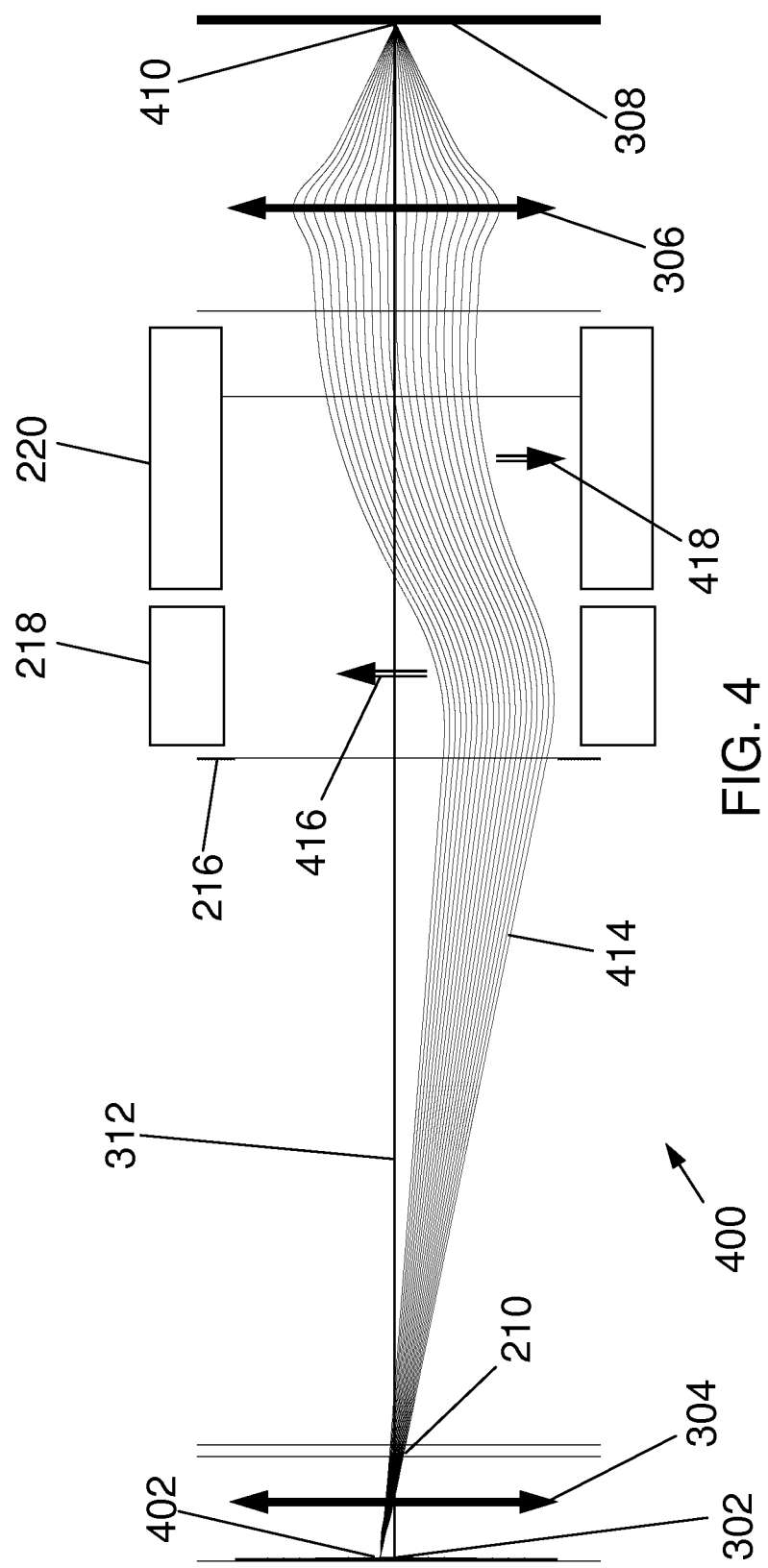
FIG. 4 is a side view of charged particle trajectories for an off-axis emitter in the source of FIG. 1 traversing the column of FIG. 2.

Below the BBA 216 are the upper deflector 218 and lower deflector 220. Both these deflectors are typically either quadrupoles or octupoles (electrostatic and/or magnetic). In all cases, deflection requires a dipole field—higher order electrode configurations such as octupoles are used to reduce deflection aberrations by producing more uniform fields, as is familiar to those skilled in the art. Deflectors 218 and 220 comprise a "double-deflector" which can control both the beam position and slope entering the main lens, as illustrated in FIGS. 3 and 4. Electrodes 222, 224 and 226 comprise the main lens, which focuses the beam 230 onto the surface of target 228 at a location 232. In the example shown here, the voltages on electrodes 222 and 226 are the same, at 0 V relative to ground. For focusing, the voltage on electrode 224 will then differ from 0 V in order to generate the necessary focusing electric fields between electrodes 222, 224, and 226. In the case of electron emission from source 202, if the voltage on electrode 224 is <0 V, the main lens is a "decelerating lens", if the voltage on electrode 224 is >0 V, then the main lens is an "accelerating lens". For the case of positive ion emission from source 202, these voltages would be reversed. Both types of main lens configurations are suitable for use with multiple emitter source 202 of the present invention.

Exemplary Trajectories for Charged Particle Emitters on- and Off-Axis

FIG. 3 is a side view 300 of charged particle trajectories for an on-axis emitter 302 (such as emitter 101 in the source 100 of FIG. 1) traversing the column 200 of FIG. 2. The column 200 has an optical axis 312, a beam defining aperture (BDA) 210, and a blanking aperture (BBA) 216. The gun lens comprising electrodes 204, 206 and 208 in FIG. 2 is represented schematically by converging lens 304. Similarly, the main lens comprising electrodes 222, 224, and 226 in FIG. 2 is illustrated by converging lens 306. In this example, emitter 302 is on-axis (corresponding to emitter 101 in FIG. 1) and the emitter 302 has been mechanically aligned to the column 200 (see alignment procedure in FIG. 16). Thus, the beam 314 is also on-axis and does not require any alignment voltages on upper deflector 218 or lower deflector 220 to aim the beam 314 into the main lens 306 both on-axis and parallel to the axis. The beam 314 is focused onto the surface of target 308 at a location 310 on-axis by main lens 306. The goal of column alignment is to ensure that the beam 314 enters the main lens 306 both on axis 312 and also traveling parallel to axis 312, as illustrated here—the various trajectories comprising the beam 314 were generated by the ray tracing program SIMION 7.0, and correspond to the column design shown in FIG. 2.

FIG. 4 is a side view 400 of charged particle trajectories for an off-axis emitter 402 (e.g., any one of the emitters 102-112 in the source 100 of FIG. 1) traversing the same column as in FIG. 3. The two key differences between FIGS. 3 and 4 are: 1) emitter 402 is off-axis, and 2) the upper deflector 218 and lower deflector 220 now are activated to generate dipole deflection electric fields with resultant force vectors on beam 414 as shown by arrows 416 and 418, respectively. The effect of emitter 402 being off-axis can be seen within the gun at the left of FIG. 4—beam 414 is initially deflected downwards towards the axis 312, emerging from the gun below axis 312 and angled downwards as shown. The alignment procedure in FIG. 16 is assumed to have been already executed to generate the required X-Y alignment deflection voltages on the upper deflector 218 and the lower deflector 220. The combined result of the beam deflections induced by the dipole fields within the deflectors 218 and 220 is to aim the beam 414 into main lens 306 both on and parallel to the axis 312. As a result, the beam is focused onto the target 308 at a location 410 on-axis (i.e., location 410 is equivalent to location 310 in FIG. 3).

First Embodiment

An Electron Source Having an Array of Six Cold Field Emitters with Backside Addressing FIG. 5(A)-(D) are various views of a first embodiment of the present invention comprising six cold field emitters with backside addressing. "Backside addressing" refers to the method for applying extraction voltages (see discussion of FIG. 1, above) to each emitter 501-506—in this addressing method, all emitters 501-506 share a common extraction electrode 508, but each emitter tip has a unique backside electrical connection 521-526, respectively. View (A) shows a top view 500 (i.e., a view looking from the column into the source—electrons would be emitted out of the plane of the figure) of the electron source wherein emitter 501 is at the center, surrounded by five off-axis emitters 502-506. View (B) is an "X-Ray" top view 520, looking through all the layers of the source from the same direction as in view (A). The six backside addressing connections 521-526 can now be seen. Views (C) 540 and (D) 560 represent cross-sections A-A and B-B, respectively, as shown in view (B). The source may be fabricated on a substrate 546, which may be either a semiconductor wafer coated with an insulating layer, such as silicon-dioxide, or an insulating material such as ceramic.

The center emitter 501 and an off-axis emitter 504 may be seen in the side cross-sectional view A-A. All six emitters 501-506 are typically fabricated from molybdenum or tungsten, and may be supported on roughly cylindrical posts 542 which may typically be nickel. Voltages are applied to each emitter 501-506 through backside connections 521-526 as shown in views (C) and (D). An insulating layer 544 supports a frontside gate layer 508 which is conducting and continuous across the front of the source as seen in view (A). This insulating layer 544 also serves to electrically isolate each of the backside connections 521-526 from each other for cases in which only some emitters are activated (resulting in voltage differences between neighboring backside connections, such as 521 and 524 in view (C)). The operation of the first embodiment of the present invention will be discussed in FIG. 12, below.

Second Embodiment

An Electron Source Having an Array of Twelve Cold Field Emitters with Backside Addressing FIG. 6(A)-(D) are various views of a second embodiment of the present invention comprising twelve cold field emitters with backside addressing. "Backside addressing" refers to the method for applying extraction voltages (see discussion of FIG. 1, above) to each emitter 601-612—in this addressing method, all emitters 601-612 share a common extraction electrode 614, but each emitter tip has a unique backside connection 621-632, respectively. View (A) shows a top view 600 (i.e., a view looking from the column into the source—electrons would be emitted out of the plane of the figure) of the electron source wherein emitter 601 is at the center, surrounded by eleven off-axis emitters 602-612. View (B) is an "X-Ray" top view 620, looking through all the layers of the source from the same direction as in view (A). The twelve backside addressing connections 621-632 can now be seen. Views (C) 640 and (D) 660 represent cross-sections C-C and D-D, respectively, as shown in view (B). The source may be fabricated on a substrate 646, which may be either a semiconductor wafer coated with an insulating layer, such as silicon-dioxide, or an insulating material such as ceramic.

The center emitter 601 and an off-axis emitter 604 may be seen in the side cross-sectional view C-C. All twelve emitters 601-612 are typically fabricated from molybdenum or tungsten, and may be supported on roughly cylindrical posts 642 which may typically be nickel. Voltages are applied to each emitter 601-612 through backside connections 621-632 as shown in views (C) and (D). An insulating layer 644 supports a frontside gate layer 614 which is conducting and continuous across the front of the source as seen in view (A). This insulating layer 644 also serves to electrically isolate each of the backside connections 621-632 from each other for cases in which only some emitters are activated (resulting in voltage differences between neighboring backside connections, such as 621 and 624 in view (C)). The operation of the second embodiment of the present invention will be discussed in FIG. 12, below.

Third Embodiment

An Electron Source Having an Array of Six Cold Field Emitters with Frontside Addressing FIG. 7(A)-(D) are various views of a third embodiment of the present invention comprising six cold field emitters with frontside addressing. "Frontside addressing" refers to the method for applying extraction voltages (see discussion of FIG. 1, above) to each emitter 701-706—in this addressing method, all emitters 701-706 share a common conducting base 746, but each emitter tip 701-706 has a unique extraction electrode 721-726, respectively. View (A) shows a top view 700 (i.e., a view looking from the column into the source—electrons would be emitted out of the plane of the figure) of the electron source wherein emitter 701 is at the center, surrounded by five off-axis emitters 702-706. View (B) is an "X-Ray" top view 720, looking through all the layers of the source from the same direction as in view (A). The six frontside addressing connections 721-726 can now be seen. Views (C) 740 and (D) 760 represent cross-sections E-E and F-F, respectively, as shown in view (B). The source may be fabricated on a conducting substrate 746, which may be either an insulating material (such as a ceramic or undoped semiconductor wafer) coated with a conducting layer (such as molybdenum or chrome), or a conducting material such as a heavily-doped semiconductor wafer.

The center emitter 701 and an off-axis emitter 704 may be seen in the side cross-sectional view E-E. All six emitters 701-706 are typically fabricated from molybdenum or tungsten, and may be supported on roughly cylindrical posts 742 which may typically be nickel. The same voltage is applied to all emitters 701-706 through the common substrate 746 as shown in views (C) and (D). An insulating layer 744 supports a frontside patterned gate layer comprising the extractor electrodes 721-726. An insulating layer 748 covers and fills between the extractors 721-726, providing electrical insulation between neighboring extractors and between the extractors and a shield layer 708 which is conducting and continuous across the front of the source as seen in view (A). The shield layer 708 serves to provide a common voltage across the front of the source to facilitate electron optical isolation between neighboring emitters during source operation. The operation of the third embodiment of the present invention will be discussed in FIG. 13, below.

Fourth Embodiment

An Electron Source Having an Array of Twelve Cold Field Emitters with Frontside Addressing FIG. 8(A)-(D) are various views of a fourth embodiment of the present invention comprising twelve cold field emitters with frontside addressing. "Frontside addressing" refers to the method for applying extraction voltages (see discussion of FIG. 1, above) to each emitter 801-812—in this addressing method, all emitters 801-812 share a common conducting base 846, but each emitter tip 801-812 has a unique extraction electrode 821-832, respectively. View (A) shows a top view 800 (i.e., a view looking from the column into the source—electrons would be emitted out of the plane of the figure) of the electron source wherein emitter 801 is at the center, surrounded by eleven off-axis emitters 802-812. View (B) is an "X-Ray" top view 820, looking through all the layers of the source from the same direction as in view (A). The twelve frontside addressing connections 821-832 can now be seen. Views (C) 840 and (D) 860 represent cross-sections G-G and H-H, respectively, as shown in view (B). The source may be fabricated on a conducting substrate 846, which may be either an insulating material (such as a ceramic or undoped semiconductor wafer) coated with a conducting layer (such as molybdenum or chrome), or a conducting material such as a heavily-doped semiconductor wafer.

The center emitter 801 and off-axis emitter 804 may be seen in the side cross-sectional view G-G. All twelve emitters 801-812 are typically fabricated from molybdenum or tungsten, and may be supported on roughly cylindrical posts 842 which may typically be nickel. The same voltage is applied to all emitters 801-812 through the common substrate 846 as shown in views (C) and (D). An insulating layer 844 supports a frontside patterned gate layer comprising the extractor electrodes 821-832. An insulating layer 848 covers and fills between the extractors 821-832, providing electrical insulation between neighboring extractors and between the extractors and a shield layer 814 which is conducting and continuous across the front of the source as seen in view (A). The shield layer 814 serves to provide a common voltage across the front of the source to facilitate electron optical isolation between neighboring emitters during source operation. The operation of the fourth embodiment of the present invention will be discussed in FIG. 13, below.

Fifth Embodiment

An Ion Source Having an Array of Twelve Gaseous Field Ionization Emitters with Frontside Addressing and Side Gas Feed Openings FIG. 9(A)-(D) are various views of a fifth embodiment of the present invention comprising twelve gaseous field-ionization (GFI) ion emitters with frontside addressing and side gas feed openings. "Frontside addressing" refers to the method for applying extraction voltages (see discussion of FIG. 1, above) to each emitter 901-912—in this addressing method, all emitters 901-912 share a common conducting base 946, but each emitter tip has a unique extraction electrode 921-932, respectively. View (A) shows a top view 900 (i.e., a view looking from the column into the source—positive ions would be emitted out of the plane of the figure) of the ion source wherein emitter 901 is at the center, surrounded by eleven off-axis emitters 902-912. View (B) is an "X-Ray" top view 920, looking through all the layers of the source from the same direction as in view (A). The twelve frontside addressing connections 921-932 can now be seen. Views (C) 940 and (D) 960 represent cross-sections I-I and J-J, respectively, as shown in view (B). The source may be fabricated on a conducting substrate 946, which may be either an insulating material (such as a ceramic or undoped semiconductor wafer) coated with a conducting layer (such as molybdenum or chrome), or a conducting material such as a heavily-doped semiconductor wafer. The substrate 946 also contains a feed gas plenum 950 which supplies the gas for ionization to each emitter tip 901-912 through individual feed holes 916 as shown in the cross-sectional side view J-J and in the x-ray view (B). Gas is supplied to the plenum 950 from a feed system (not shown) which regulates the pressure to prevent excessive gas flow through holes 916 which might induce vacuum breakdown and arcing between the emitter tips 901-912 and extractors 921-932, respectively.

The center emitter 901 and off-axis emitter 904 may be seen in the side cross-sectional view I-I. All twelve emitters 901-912 are typically fabricated from molybdenum or tungsten, and may be supported on roughly cylindrical posts 942 which may typically be nickel. The same voltage is applied to all emitters 901-912 through the common substrate 946 as shown in views (C) and (D). An insulating layer 944 supports a frontside patterned gate layer comprising the extractor electrodes 921-932. An insulating layer 948 covers and fills between the extractors 921-932, providing electrical insulation between neighboring extractors and between the extractors and a shield layer 914 which is conducting and continuous across the front of the source as seen in view (A). The shield layer 914 serves to provide a common voltage across the front of the source to facilitate electron optical isolation between neighboring emitters during source operation. The operation of the fifth embodiment of the present invention will be discussed in FIG. 13, below.

Sixth Embodiment

An Ion Source Having an Array of Twelve Gaseous Field Ionization Emitters with Frontside Addressing and Axial Gas Feed Openings FIG. 10(A)-(D) are various views of a sixth embodiment of the present invention comprising twelve gaseous field-ionization (GFI) emitters with frontside addressing and axial gas feed openings. "Frontside addressing" refers to the method for applying extraction voltages (see discussion of FIG. 1, above) to each emitter 1001-1012—in this addressing method, all emitters 1001-1012 share a common conducting base 1046, but each emitter tip has a unique extraction electrode 1021-1032, respectively. View (A) shows a top view 1000 (i.e., a view looking from the column into the source—positive ions would be emitted out of the plane of the figure) of the ion source wherein emitter 1001 is at the center, surrounded by eleven off-axis emitters 1002-1012. View (B) is an "X-Ray" top view 1020, looking through all the layers of the source from the same direction as in view (A). The twelve frontside addressing connections 1021-1032 can now be seen. Views (C) 1040 and (D) 1060 represent cross-sections K-K and L-L, respectively, as shown in view (B). The source may be fabricated on a conducting substrate 1046, which may be either an insulating material (such as a ceramic or undoped semiconductor wafer) coated with a conducting layer (such as molybdenum or chrome), or a conducting material such as a heavily-doped semiconductor wafer. The substrate 1046 also contains a feed gas plenum 1050 which supplies the gas for ionization to each emitter tip 1001-1012 through center openings 1016 as shown in the cross-sectional side view L-L. Gas is supplied to the plenum 1050 from a feed system (not shown) which regulates the pressure to prevent excessive gas flow through center openings 1016 which might induce vacuum breakdown and arcing between the emitter tips 1001-1012 and extractors 1021-1032, respectively.

The center emitter 1001 and off-axis emitter 1004 may be seen in a side cross-sectional view K-K. All twelve emitters 1001-1012 are typically fabricated from molybdenum or tungsten, and may be supported on roughly cylindrical hollow posts 1042 which may typically be nickel. The same voltage is applied to all emitters 1001-1012 through the common substrate 1046 as shown in views (C) and (D). An insulating layer 1044 supports a frontside patterned gate layer comprising the extractor electrodes 1021-1032. An insulating layer 1048 covers and fills between the extractors 1021-1032, providing electrical insulation between neighboring extractors and between the extractors and a shield layer 1014 which is conducting and continuous across the front of the source as seen in view (A). The shield layer 1014 serves to provide a common voltage across the front of the source to facilitate electron optical isolation between neighboring emitters during source operation. The operation of the sixth embodiment of the present invention will be discussed in FIG. 13, below.

Seventh Embodiment

Figure 10:
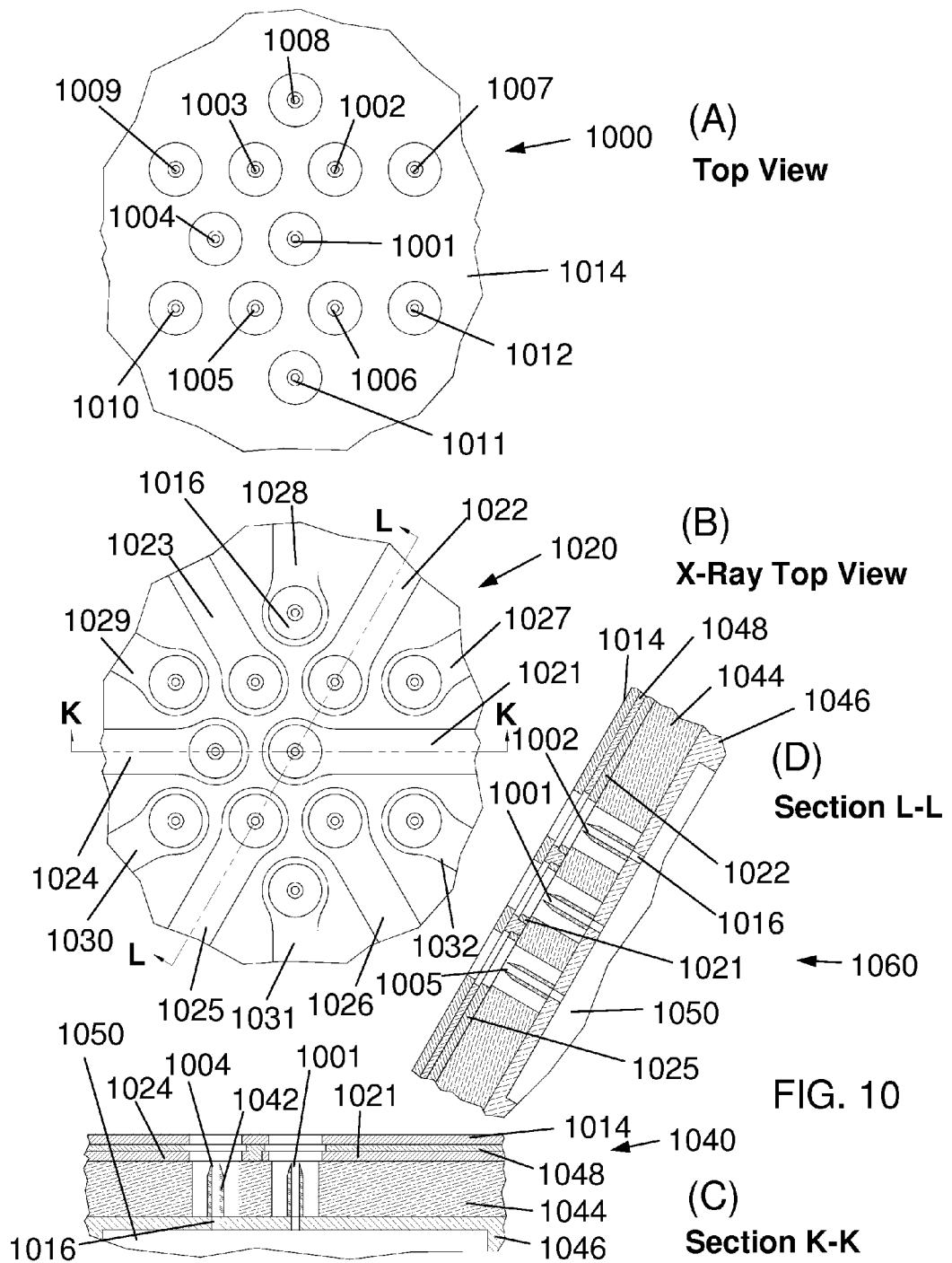
FIG. 10(A)-(D) are various views of a sixth embodiment of the present invention comprising twelve gaseous field-ionization ion emitters with frontside addressing and axial gas feed openings.
Figure 11:
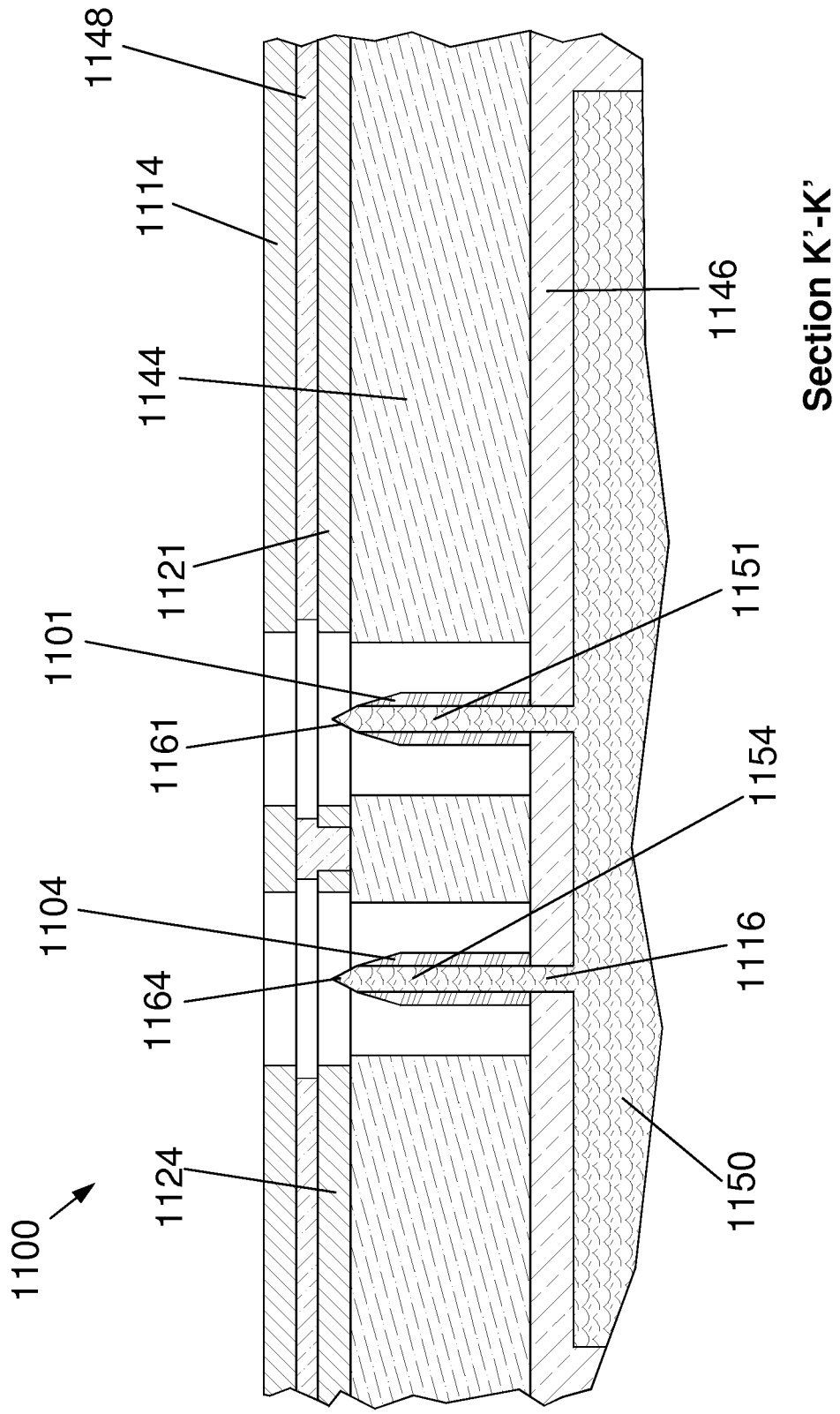
FIG. 11 is a side cross-sectional view of a seventh embodiment of the present invention comprising multiple liquid metal ion sources with frontside addressing and axial liquid metal feed openings.

An Ion Source Having an Array of Twelve Liquid Metal Ion Emitters with Frontside Addressing and Axial Liquid Metal Feed Openings FIG. 11 is a side cross-sectional view of a seventh embodiment 1100 of the present invention comprising multiple liquid metal ion sources with frontside addressing and axial liquid metal feed openings. The overall source structure for this seventh embodiment is the same as the sixth embodiment in FIG. 10 with the exception that the plenum 1050 and feed openings are now used to transport a liquid metal for ionization to each emitter tip. Typical liquid metals may be pure metals such as gallium or indium, or alloys such as silicon-gold, beryllium-silicon-gold, beryllium-gold, etc. For some metals, such as gallium, little or no heating is necessary to melt the metal and enable it to flow from the plenum 1150 through openings 1116, 1151, and 1154 to form Taylor cones such as 1161 and 1164. Other metals will require some amount of heating to reach their melting points—typical maximum melting points may be at most a few hundred degrees Celsius. Side cross-sectional view K'-K' corresponds to side cross-sectional view K-K in FIG. 10, with the addition of the liquid metal in the plenum 1150, in the openings 1116, 1151 and 1154, and forming the Taylor cones 1161 and 1164. Taylor cones 1161 and 1164 are centered on the extractors 1121 and 1124, respectively, by the hollow posts 1101 and 1104. All twelve support posts (only 1101 and 1104 are shown in FIG. 11) could typically be fabricated from molybdenum or tungsten. The same voltages is applied to each support post through the common substrate 1146. An insulating layer 1144 supports a frontside patterned gate layer comprising the extractor electrodes, such as 1121 and 1124. An insulating layer 1148 covers and fills between the extractors, providing electrical insulation between neighboring extractors and between the extractors and the shield layer 1114 which is conducting and continuous across the front of the source as seen in view (A). The shield layer 1114 serves to provide a common voltage across the front of the source to facilitate electron optical isolation between neighboring emitters during source operation. The operation of the seventh embodiment of the present invention will be discussed in FIG. 13, below.

Electrical Control Circuitry for the Various Embodiments

Figure 5:
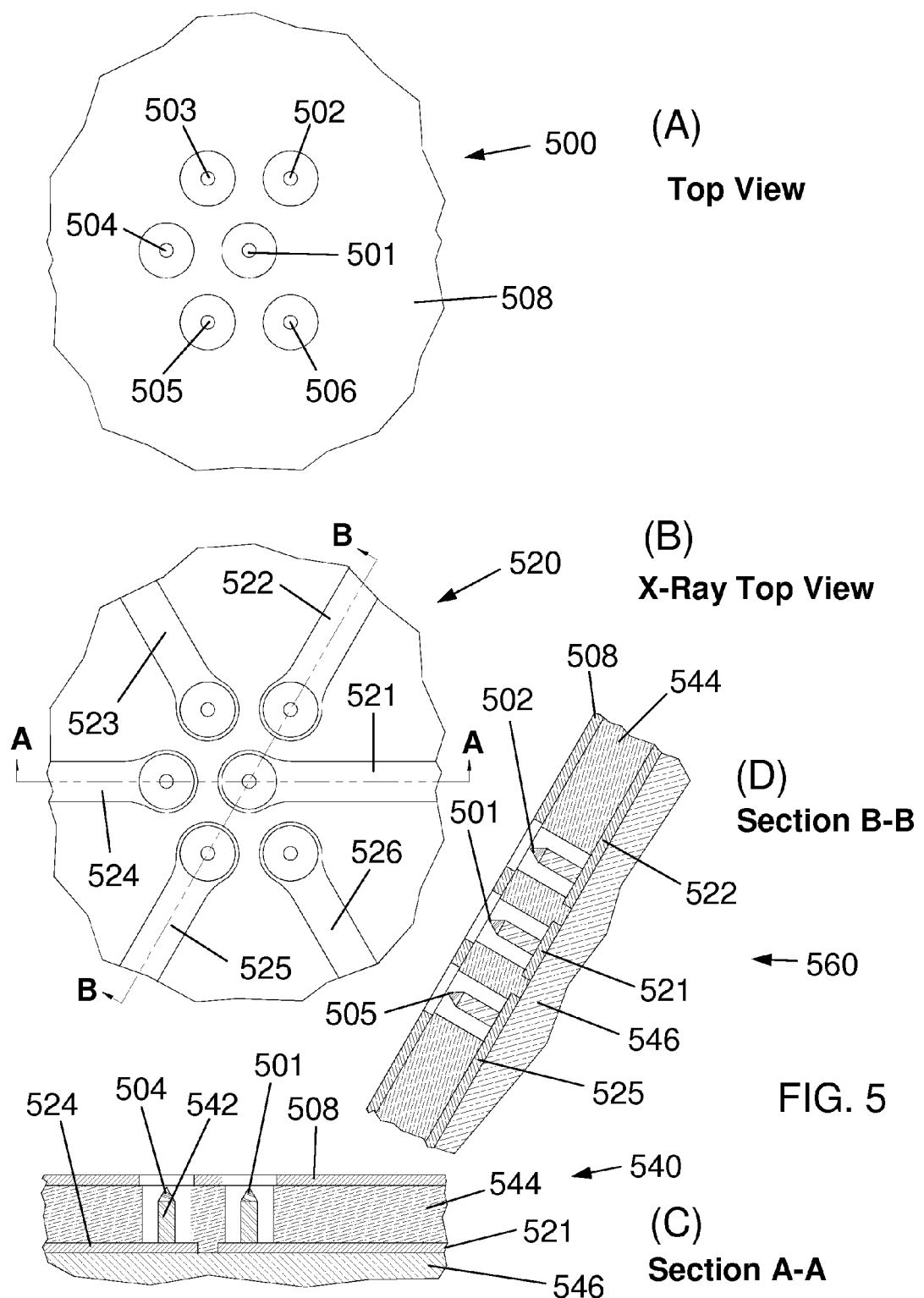
FIG. 5(A)-(D) are various views of a first embodiment of the present invention comprising six cold field emitters with backside addressing.
Figure 6:
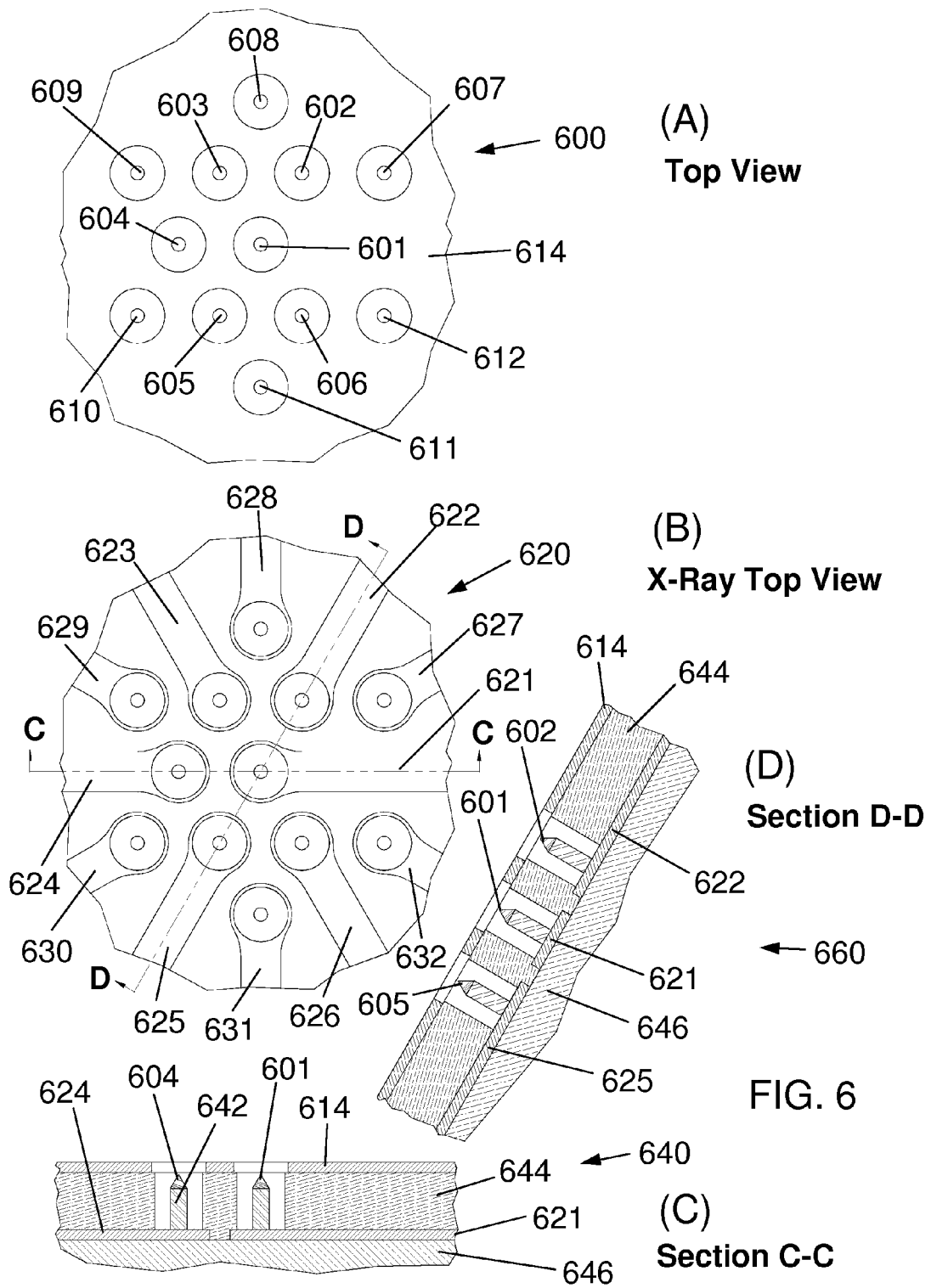
FIG. 6(A)-(D) are various views of a second embodiment of the present invention comprising twelve cold field emitters with backside addressing.
Figure 7:
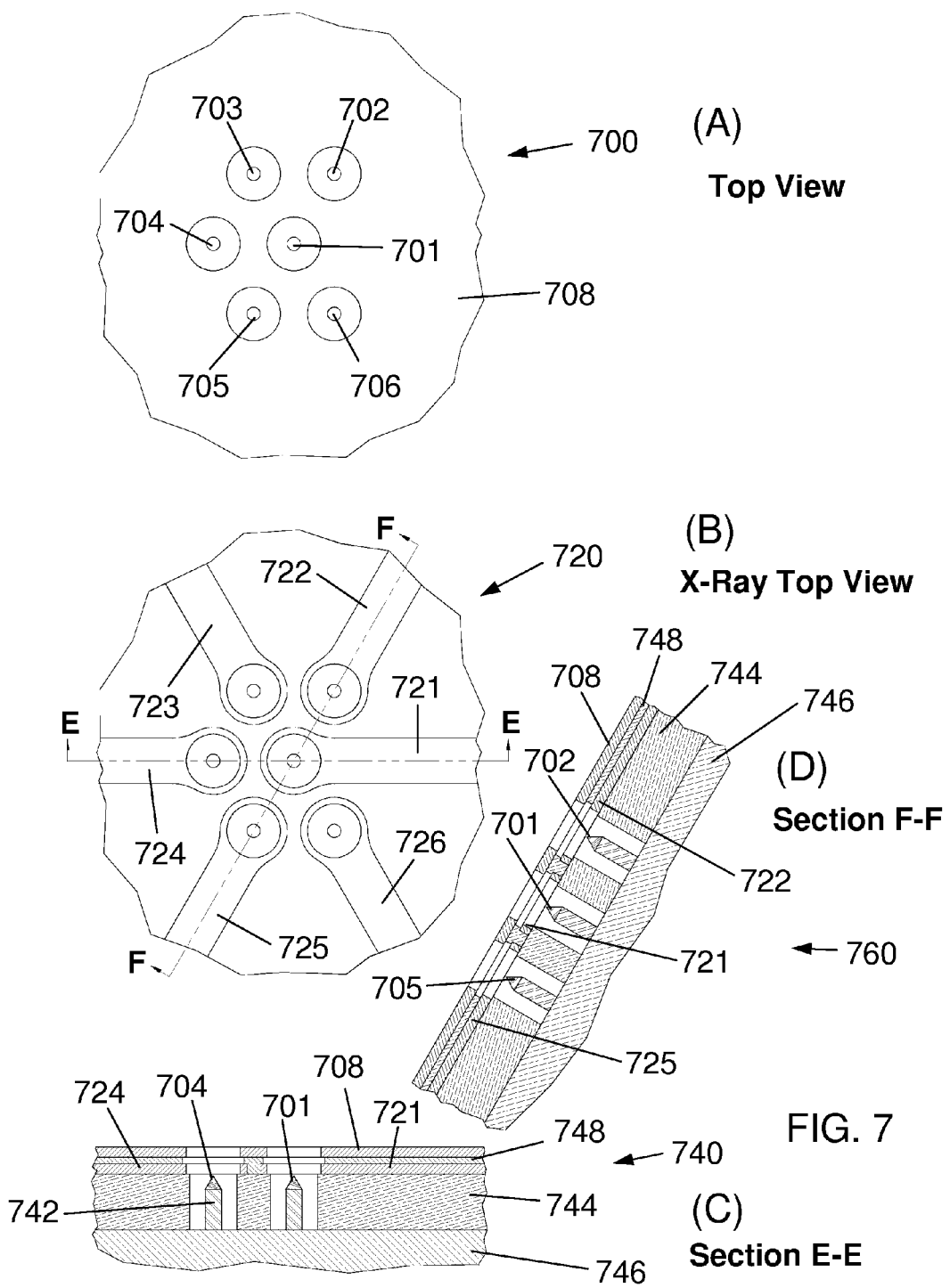
FIG. 7(A)-(D) are various views of a third embodiment of the present invention comprising six cold field emitters with frontside addressing.
Figure 8:
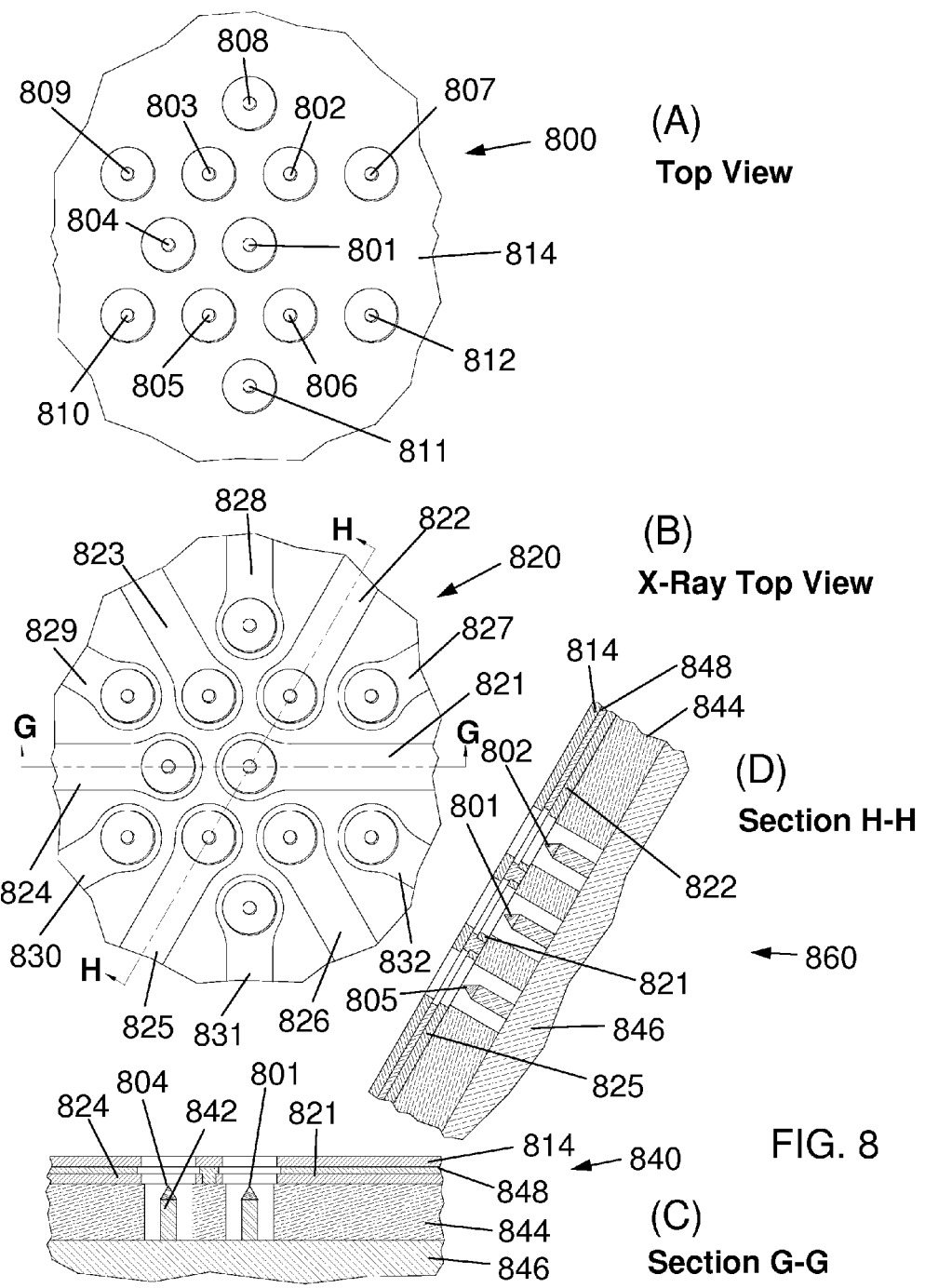
FIG. 8(A)-(D) are various views of a fourth embodiment of the present invention comprising twelve cold field emitters with frontside addressing.
Figure 12:
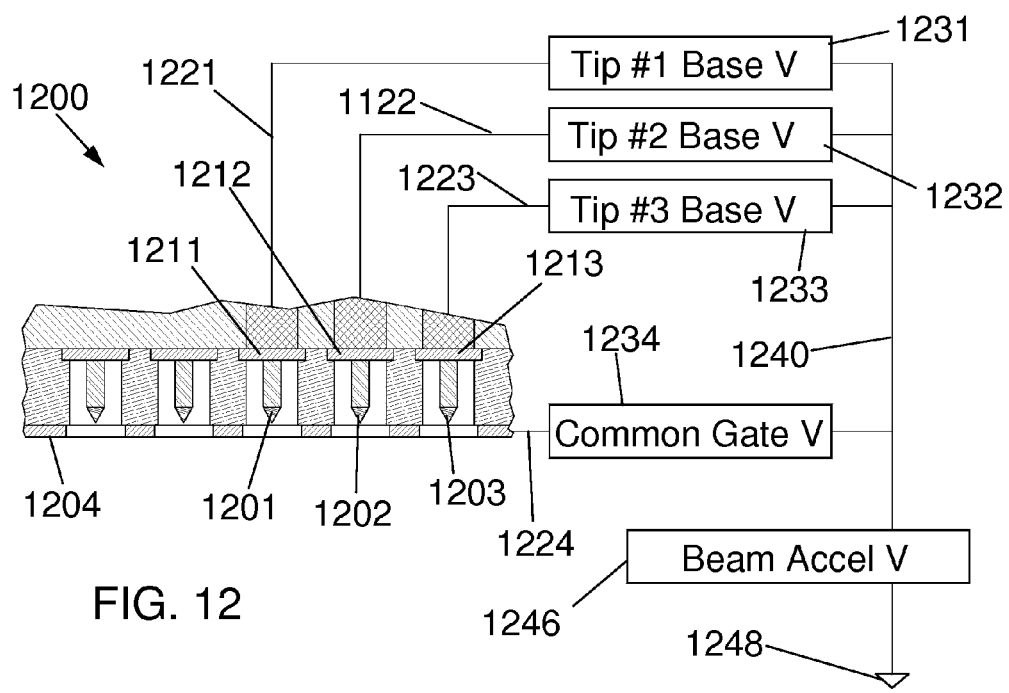
FIG. 12 is a simplified electrical schematic diagram of control circuitry for a charged particle source of the present invention with backside addressing.

FIG. 12 is a simplified electrical schematic diagram of control circuitry for a charged particle source of the present invention with backside addressing—this circuitry is applicable to the first and second embodiments shown in FIGS. 5-6. Voltages are conveyed to emitters 1201-1203 through the three backside connections 1211-1213, respectively, which are, in turn, connected to biasing power supplies 1231-1233 through wires 1221-1223. The biasing power supplies 1231-1233 supply the extraction voltages for the tips 1201-1203 relative to a common gate (extraction) electrode 1204. Common gate voltage power supply 1234 is connected through wire 1224 to the common gate 1204. Beam accelerating voltage power supply 1246 is connected between ground 1248 and the common reference voltage connection 1240 for power supplies 1231-1234. To illustrate the operation of this circuit, assume that we want emission from emitter 1201, but we do not want emission from emitters 1202 and 1203. First, power supplies 1231-1234 and 1246 are set to 0 V output, as an initialization step. Assume that the required voltage difference between any emitter 1201-1203 and the common extractor 1204 to induce charged particle emission is $V_{extraction}$. Second, the beam accelerating voltage supply 1246 is set to supply a voltage to the common connection 1240 which corresponds to the desired energy for the charged particles (electrons or ions) to be emitted from tip 1201. Third, all four supplies 1231-1234 are set to supply output voltages equal to $V_{extraction}$. At this point, there will be no voltage differences between any of the three emitters 1201-1203 and the common gate (extractor) 1204—thus, emitters remain inactivated and are not emitting charged particles. Next, to activate emitter 1201, the voltage output from power supply 1231 is reduced to 0 V—now there will be a voltage difference between emitter 1201 and the common gate 1204 equal to $V_{extraction}$, thereby inducing emission from tip 1201, while for tips 1202-1203 there will still be no emission since there will be no voltage difference between tips 1202-1203 and the common gate 1204. Similar procedures would be followed to activate either tip 1202 or 1203. To activate two or more tips out of the array of tips 1201-1203 simultaneously (see FIG. 15), the corresponding power supplies out of 1231-1233 would be set to 0 V output. The example shown here illustrates control of only three emitters 1201-1203, but clearly the number of tip bias voltage supplies would be set equal to the number of emitters in the source to be controlled, such as, for example, six for FIGS. 5 and 7, and twelve for FIGS. 6 and 8-11.

Figure 13:
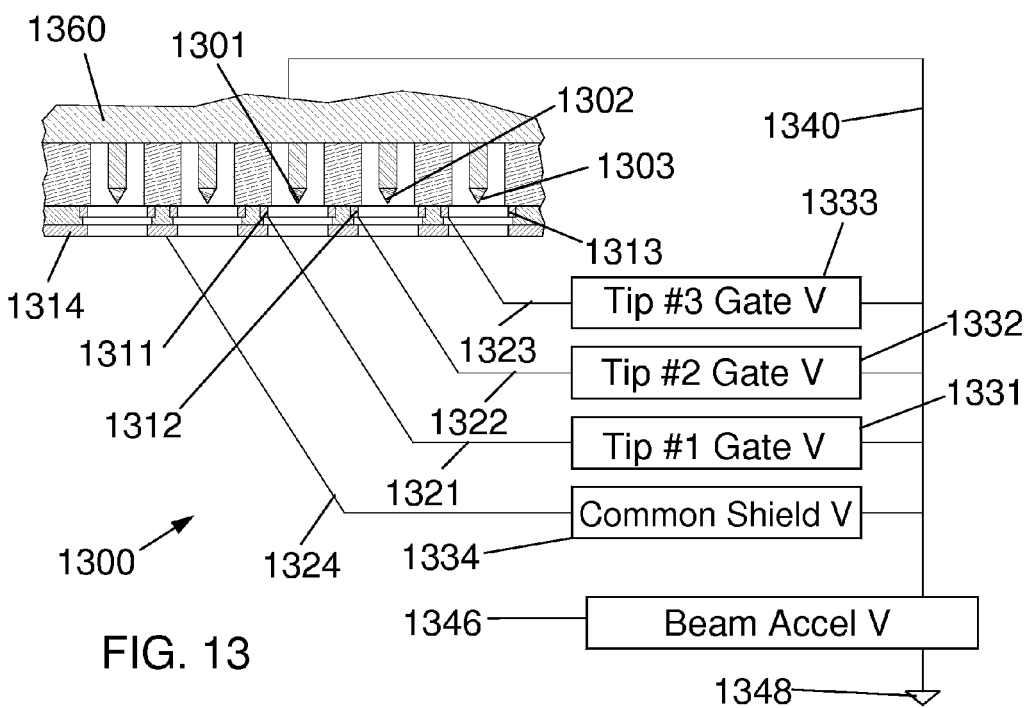
FIG. 13 is a simplified electrical schematic diagram of control circuitry for a charged particle source of the present invention with frontside addressing.

FIG. 13 is a simplified electrical schematic diagram of control circuitry for a charged particle source of the present invention with frontside addressing—this is applicable to the third through seventh embodiments shown in FIGS. 7-11. All of the emitters 1302-1303 are connected in common through the substrate 1360 and connection 1340 to a beam accelerating voltage supply 1346. Voltages are conveyed to extractors 1311-1313 through three frontside connections 1321-1323, respectively, which are, in turn, connected to gate power supplies 1331-1333 through wires 1321-1323. Gate power supplies 1331-1333 supply the extraction voltages for the tips 1201-1203 relative to the common base voltage. Common shield voltage power supply 1334 is connected through wire 1324 to the common shield electrode 1314. Beam accelerating voltage power supply 1346 is connected between ground 1348 and the common reference voltage connection 1340 for power supplies 1331-1334. To illustrate the operation of this circuit, assume that we want emission from emitter 1301, but we do not want emission from emitters 1302 and 1303. First, power supplies 1331-1334 and 1346 are set to 0 V output, as an initialization step. Assume that the required voltage difference between any emitter 1301-1303 and its respective extractor 1311-1313 to induce charged particle emission is $V_{extraction}$. Second, the beam accelerating voltage supply 1346 is set to supply a voltage to the common connection 1340 which corresponds to the desired energy for the charged particles (electrons or ions) to be emitted from tip 1301. Third, the common shield voltage power supply 1334 is set to supply a shield voltage, which may typically be equal to or greater than $V_{extraction}$. At this point, there will be no voltage differences between any of the three emitters 1301-1303 and the three extractors 1311-1313, respectively—thus, all emitters remain inactivated and are not emitting charged particles. Next, to activate emitter 1301, the voltage output from power supply 1331 is increased to $V_{extraction}$—now there will be a voltage difference between emitter 1301 and extractor 1311 equal to $V_{extraction}$, thereby inducing emission from tip 1301, while for tips 1302-1303 there will still be no emission since there will be no voltage difference between tips 1302-1303 and extractors 1312-1313, respectively. Similar procedures would be followed to activate either tip 1302 or 1303. To activate two or more tips out of the array of tips 1301-1303 simultaneously (see FIG. 15), the corresponding power supplies out of 1331-1333 would be set to $V_{extraction}$ at the same time. The example shown here illustrates control of only three emitters 1301-1303, but clearly the number of gate bias voltage supplies would be set equal to the number of emitters in the source to be controlled, such as, for example, six for FIGS. 5 and 7, and twelve for FIGS. 6 and 8-11.

Figure 9:
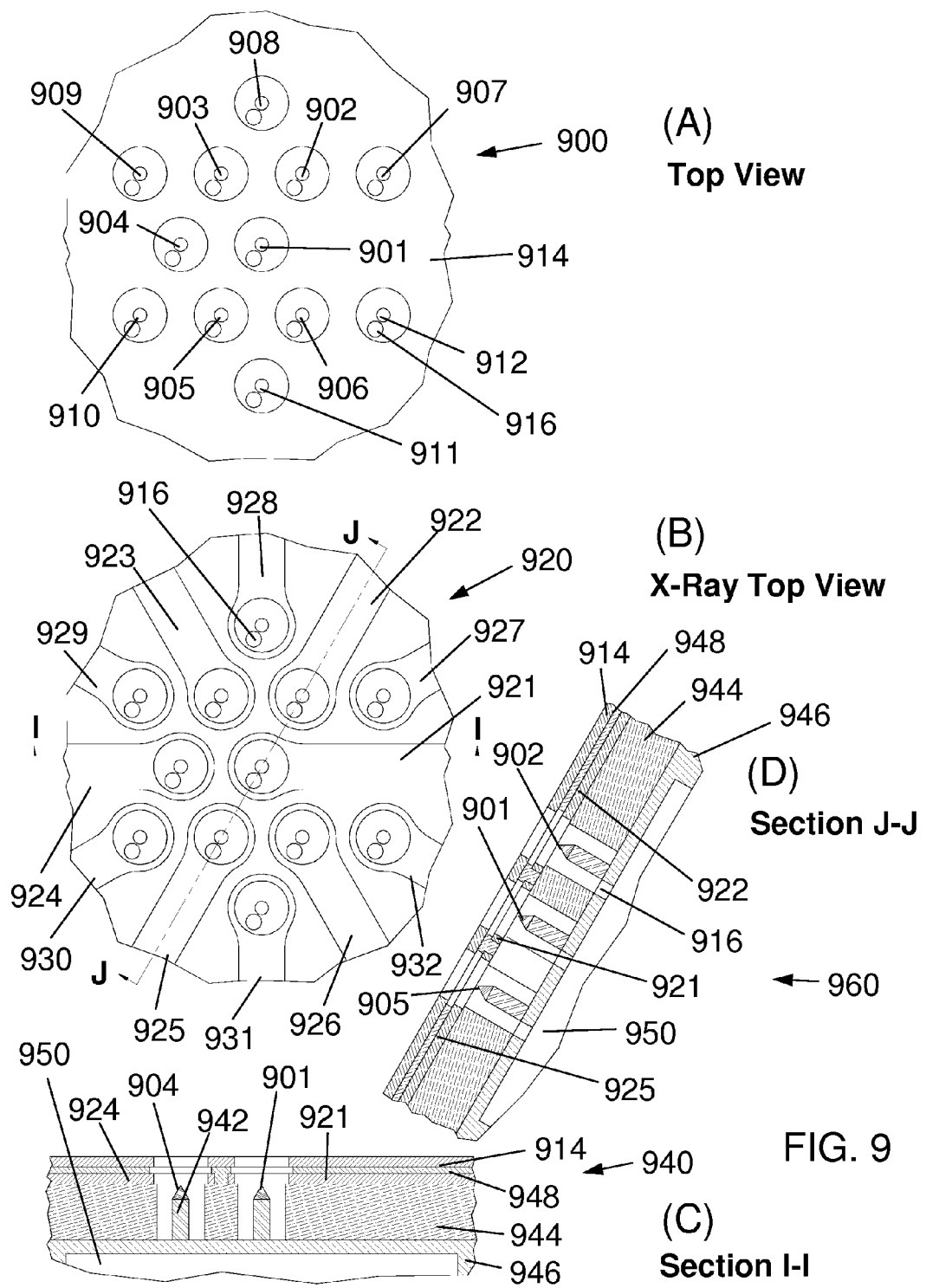
FIG. 9(A)-(D) are various views of a fifth embodiment of the present invention comprising twelve gaseous field-ionization ion emitters with frontside addressing and side gas feed openings.
Figure 14A:
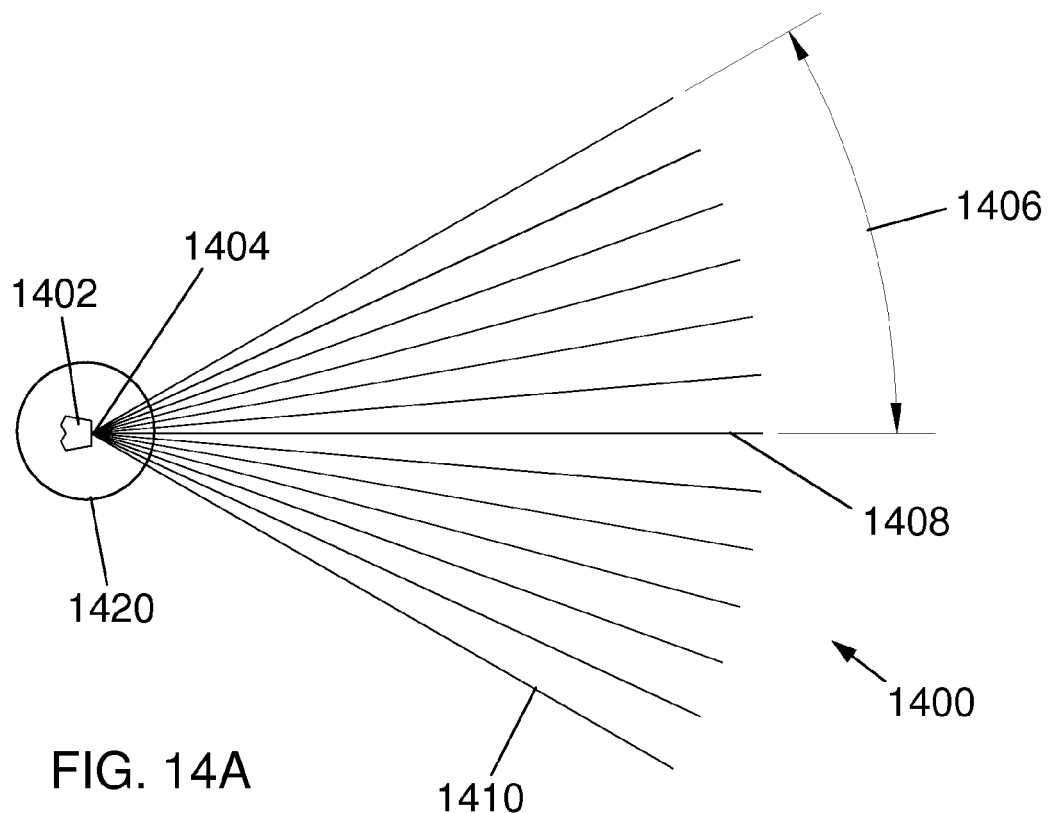
FIG. 14A is a side schematic diagram of charged particles being emitted from a single charged particle emitter within the array of emitters of FIG. 1.

Angular Intensities and Brightnesses for Different Operating Modes of the Various Embodiments FIG. 14A is a side schematic diagram 1400 of charged particles being emitted from a single charged particle emitter 1404 within a source 1402. Charged particles, either electrons as in FIGS. 5-8 or ions as in FIGS. 9-11, are typically emitted into a conical solid angle 1410 with a half-angle 1406 of approximately 30° (~0.52 radians) centered on an emission axis 1408. The angular intensity of the source 1402 is then:

Angular Intensity=(Current from emitter 1404)/[π (angle 1406)$^2$].

The brightness is:

Brightness=(Angular Intensity)/[π(diameter of virtual source)$^2$/4].

In the example in FIG. 14A, the diameter of the virtual source may be very small for the case of cold field emitters such as in FIGS. 5-8, thus the brightness of source 1402 operating in the single emitter mode (i.e., with only one emitter activated) can be very high even in cases where the angular intensity is not necessarily very large. Thus, single emitter operation may be termed "high brightness mode".

Figure 14B:
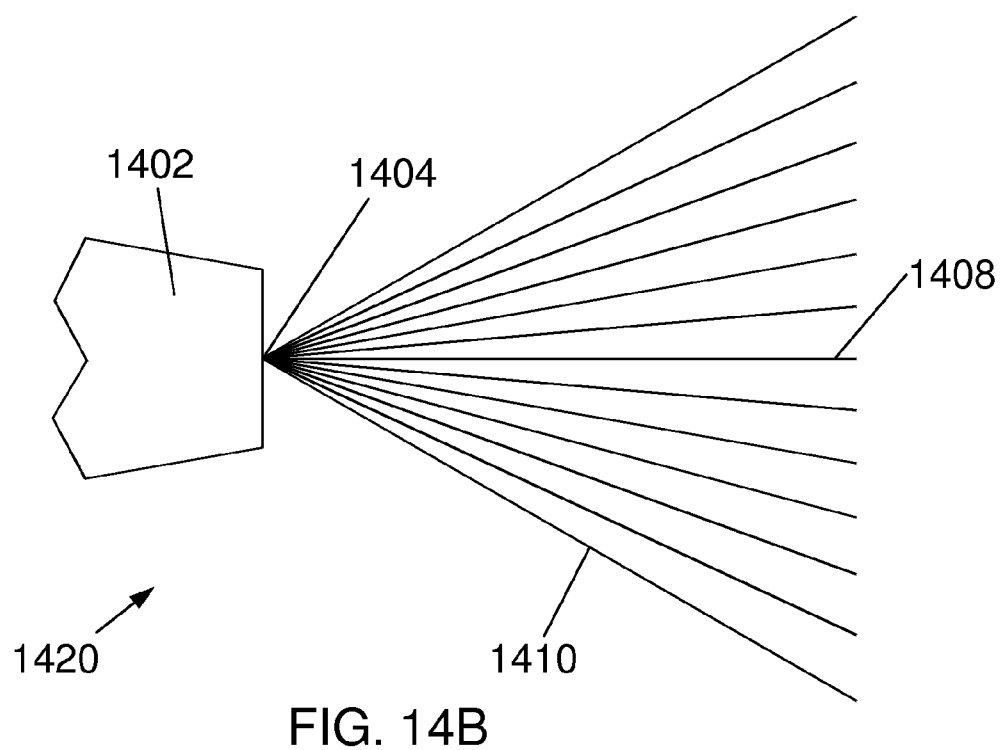
FIG. 14B is a close-up schematic diagram of the charged particle source in FIG. 14A.

FIG. 14B is a close-up schematic diagram 1420 of the charged particle source shown in FIG. 14A, illustrating the very small virtual source size, which for cold field emitters can range down to approximately 2 nm diameter, while for liquid metal sources it can be in the range 20 nm diameter.

Figure 15A:
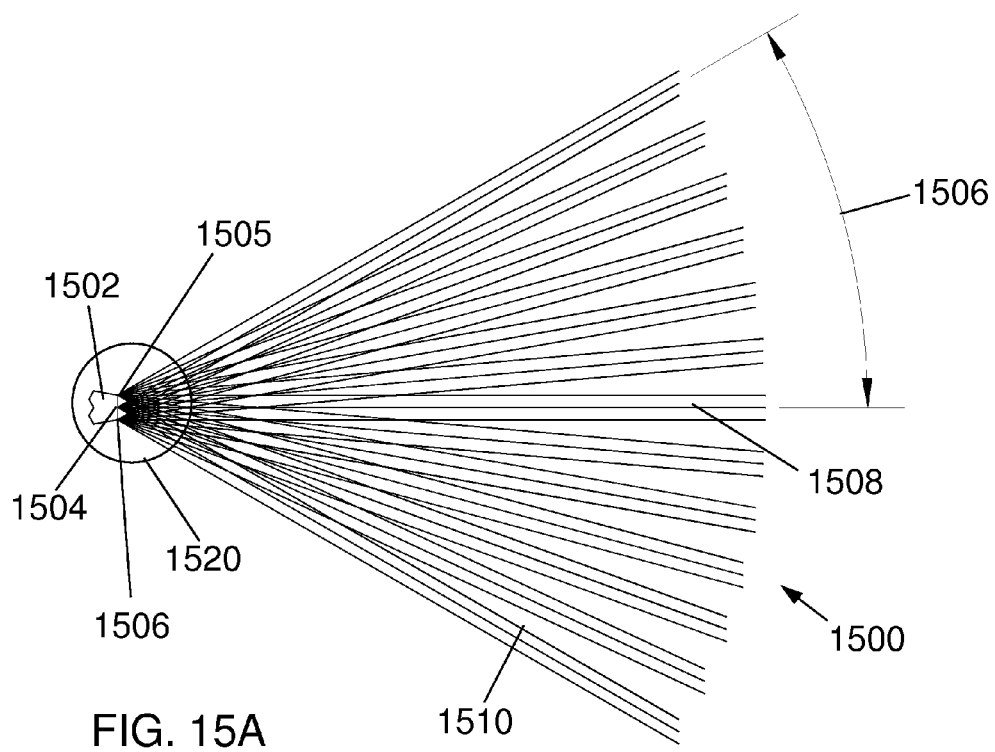
FIG. 15A is a side schematic diagram of charged particles being emitted from a multiplicity of charged particle emitters within the array of emitters of FIG. 1.

FIG. 15A is a side schematic diagram 1500 of charged particles being emitted from three charged particle emitters 1504-1506 within an array of emitters within a source 1502. Charged particles, either electrons as in FIGS. 5-8 or ions as in FIGS. 9-11, are typically emitted into a conical solid angle 1510 with a half-angle 1506 of approximately 30° (~0.52 radians) centered on an emission axis 1508. Note that at distances much larger than the size of source 1502, all of these conical emission patterns merge into a single cone of charged particles having a total current equal to the sum of the emission currents of each individual emitter 1504-1506. The angular intensity of the source 1502 is then:

Angular Intensity=(Total current from emitters 1504-1506)/[π(angle 1506)$^2$].

The brightness is:

Brightness=(Angular Intensity)/[π(diameter of virtual source 1514)$^2$/4].

Figure 15B:
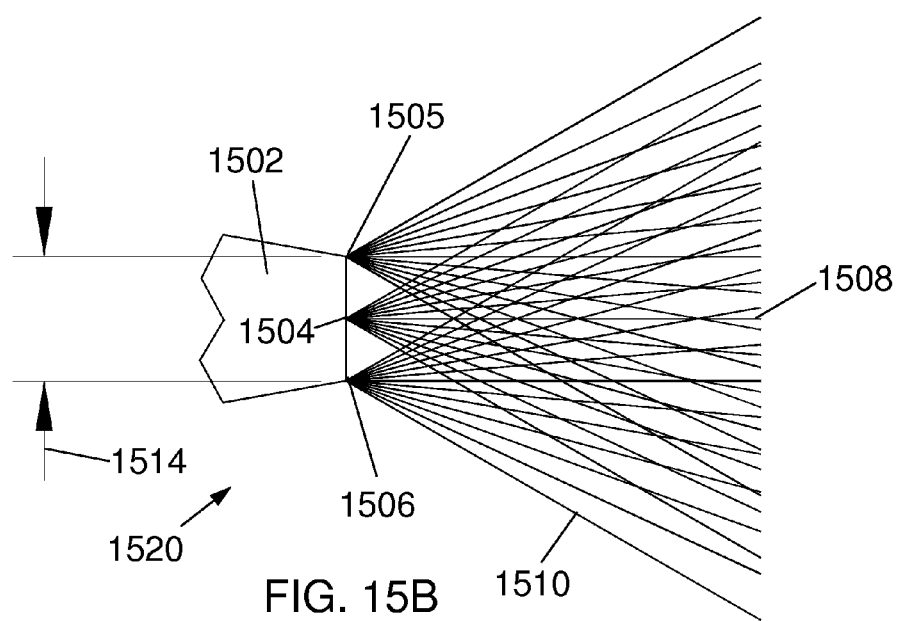
FIG. 15B is a close-up schematic diagram of the charged particle source in FIG. 15A.

In the example in FIG. 15A, the diameter of the virtual source is no longer determined by the virtual source size of a single emitter, and, instead, depends on the overall distribution of emitters 1504-1506 within source 1502, as illustrated in FIG. 15B.

FIG. 15B is a close-up schematic diagram 1520 of the charged particle source shown in FIG. 15A. The overall spatial distribution of emitters 1504-1506 spans a distance 1514 perpendicular to the emission axis 1508. Thus, for calculation of brightness, the virtual source size is much larger than in FIG. 14, resulting in lower brightness for this operating mode. However, since the total emission current is now increased by the total number of activated emitters (three in this example), the angular intensity is increased. Thus, multiple emitter operation may be termed "high angular intensity mode".

Alignment Process for the Multiple Emitter Source of the Present Invention

FIG. 16 is a flow chart for an alignment process 1600 applicable to the multiple emitter source of the present invention. This alignment process, as discussed in FIG. 1, above, mechanically aligns the center emitter (such as emitter 101 in FIG. 1), and then uses electrical alignments for all the other (off-axis) emitters in the emitter array (such as emitters 102-112 in FIG. 1). First, in block 1602, the electronics for controlling the charged particle gun are set to wobble the gun lens strength up and down (by means of either a periodic voltage or a lens current oscillation) at a very low frequency such as 0.1 to 0.3 Hz, slow enough to enable the system operator to follow the image as it wobbles (i.e., moves side-to-side and/or up-and-down on the imaging screen of the charged particle system). Next, in block 1604, only the center emitter (such as 101 in FIG. 1) is activated to emit charged particles down the column, thereby forming an image of the target in block 1606. In general, this image will initially exhibit some wobbling since it is rare that the source will happen to be aligned without some mechanical adjustment being necessary. If the image is judged to be wobbling in decision block 1608, then path 1610 is taken to block 1612 where the source mechanical motions are used to reposition the entire emitter array relative to the column axis. Usually, there is a known correlation between the observed image wobble axis and magnitude and the correct mechanical motion to reduce this wobbling. Once the source has been moved, path 1614 is taken back to block 1606 where subsequent target imaging is performed to observe any remaining image wobble. Once the image is judged to no longer be wobbling in block 1608, the center emitter is considered to be adequately mechanically aligned to the column, and path 1616 is taken to block 1632 within repeat block 1630.

All of the blocks within repeat block 1630 are executed for emitters k=2, 3, ..., N, where N is the total number of emitters in the array. This allows each of the off-axis emitters k (k>1) to be electrically aligned to the column. Note that this is different than the case for the center emitter which was mechanically aligned to the column. Because the emitter array as approximately centered on the center emitter, the mechanical alignment of the source array minimizes the average misalignment of the off-axis emitters, thereby reducing the average X-Y alignment voltages. After activating emitter k in block 1632, an image is formed in block 1634, the same as in block 1606. If decision block 1636 determines that the image is wobbling, path 1638 is taken to block 1640 where a systematic procedure is used to set the X-Y alignment deflections (which may be voltages for an electrostatic deflector, or currents for a magnetic deflector). Usually, there is a known correlation between the observed image wobble axis and magnitude and the correct electrical X-Y beam deflections to reduce this wobbling. Once the X-Y alignment deflections have been changed and saved for emitter k in block 1640, path 1642 is taken back to block 1634 where subsequent target imaging is performed to observe any remaining image wobble. Once the image is judged to no longer be wobbling in block 1636, emitter k is considered to be adequately electrically aligned to the column. If k<N, then k is incremented by 1 and block 1630 is repeated. If k=N, then path 1644 is taken to block 1650 signifying that all emitters within the source (such as emitters 101-112 in FIG. 1) are ready for operation.

While the emitters are described as electrically addressable, it is also possible to mechanically move emitters to align them with the column axis.

Although embodiments of the present invention and their advantages have been described in detail, it should be understood that various changes, substitutions and alterations can be made to the embodiments described herein without departing from the spirit and scope of the invention as defined by the appended claims. The voltage source for the grids may come from a single power source and use a voltage divider, separate power sources can be used for each grid, or some combination of voltage drivers and power sources may be used. While the examples provide an electric field to alter the trajectories of the secondary particles, a magnetic field could be used, although the effect of the magnetic field on the primary beam must be considered. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim as follows:

1. A charged particle system, comprising:
   a column for focusing a charged particle beam along an axis onto the surface of a target;
   a charged particle source comprising a multiplicity of charged particle emitters located about the axis, each configured to emit charged particles along and generally parallel to the axis of the column;
   a multiplicity of electrical connections, configured with one connection to each emitter or a group of less than all the emitters in the multiplicity of charged particle emitters; and
   an emitter control circuit for controlling the multiplicity of charged particle emitters.

2. The charged particle system of claim 1 wherein the emitter control circuit can cause less than all the emitters to emit simultaneously.

3. The charged particle system of claim 1 wherein the emitter control circuit can cause multiple emitters to emit simultaneously, the multiple emitters producing charged particles that are focused by the column.

4. The charged particle system of claim 1 wherein the emitter control circuit can cause the charged particle system to operate in a mode in which a single emitter emits charged particle or a mode in which multiple emitters simultaneously emit charged particles.

5. The charged particle system of claim 1 wherein at least two of the emitters can be independently addressed to emit charged particles or not to emit charged particles, allowing the emitters to emit simultaneously or sequentially.

6. The charged particle system of claim 1 wherein the emitters are cold field electron emitters, gaseous field ionization ion emitters, or liquid metal ion emitters.

7. The charged particle system of claim 1 wherein each emitter within the multiplicity of charged particle emitters comprises an emitter tip and an extraction electrode.

8. The charged particle system of claim 7 wherein the emitter control circuit is configured to apply separate voltages to each emitter tip.

9. The charged particle system of claim 7 wherein the emitter control circuit is configured to apply separate voltages to each extraction electrode.

10. An electron beam system, comprising:
    a column for focusing an electron beam along an axis onto the surface of a target;
    an electron source comprising a multiplicity of electron emitters located about the axis, each configured to emit electrons along and generally parallel to the axis of the column;
    a multiplicity of electrical connections, configured with one connection to each emitter in the multiplicity of electron emitters; and
    an emitter control circuit.

11. The electron beam system of claim 10 wherein the electron emitters are cold field emitters, and wherein each cold field emitter comprises an emitter tip and an extraction electrode.

12. The electron beam system of claim 10 wherein the emitter control circuit is configured to apply separate voltages to each emitter tip.

13. The electron beam system of claim 10 wherein the emitter control circuit is configured to apply separate voltages to each extraction electrode.

14. A focused ion beam system, comprising:
- a column for focusing an ion beam along an axis onto the surface of a target;
- an ion source comprising a multiplicity of ion emitters located about the axis, each configured to emit ions along and generally parallel to the axis of the column;
- a multiplicity of electrical connections, configured with one connection to each emitter in the multiplicity of ion emitters; and
- an emitter control circuit.

15. The focused ion beam system of claim 14 wherein the ion emitters are gaseous field ionization ion emitters, and wherein each gaseous field ionization ion emitter comprises an emitter tip and an extraction electrode.

16. The focused ion beam system of claim 14 wherein the emitter control circuit is configured to apply separate voltages to each emitter tip.

17. The focused ion beam system of claim 14 wherein the emitter control circuit is configured to apply separate voltages to each extraction electrode.

18. The focused ion beam system of claim 14 wherein the ion emitters are liquid metal ion emitters, and wherein each liquid metal ion emitter comprises an emitter tip and an extraction electrode.

19. A method of operating a charged particle beam system;
- providing multiple charged particle emitters located about an axis;
- providing a focusing column along the axis capable of focusing the charged particles from the multiple emitters along the axis onto the sample surface; and
- causing charged particles to be emitted sequentially from the multiple charged particles emitters and focused by the focusing column.

20. The method of claim 19 further comprising causing charged particles to be emitted simultaneously from the multiple charged particles emitters and focused by the focusing column.

* * * * *